United States Patent
Xu et al.

(10) Patent No.: US 12,374,619 B2
(45) Date of Patent: Jul. 29, 2025

(54) MICROELECTRONIC DEVICES WITH DIFFERENT STAIRCASED STADIUMS HAVING CONSISTENT MULTI-TIER STEP RISER HEIGHT, AND RELATED SYSTEMS AND METHODS

(71) Applicant: Micron Technology, Inc., Boise, ID (US)

(72) Inventors: Lifang Xu, Boise, ID (US); Harsh Narendrakumar Jain, Boise, ID (US); Indra V. Chary, Boise, ID (US); Umberto Maria Meotto, Rivoli (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 509 days.

(21) Appl. No.: 17/657,264

(22) Filed: Mar. 30, 2022

(65) Prior Publication Data
US 2023/0317604 A1   Oct. 5, 2023

(51) Int. Cl.
*H01L 23/52*     (2006.01)
*H01L 21/768*    (2006.01)
(Continued)

(52) U.S. Cl.
CPC ..... *H01L 23/5283* (2013.01); *H01L 21/76816* (2013.01); *H01L 21/76877* (2013.01); *H01L 23/5226* (2013.01); *H10B 20/50* (2023.02); *H10B 41/20* (2023.02); *H10B 41/27* (2023.02); *H10B 41/50* (2023.02); *H10B 43/20* (2023.02);
(Continued)

(58) Field of Classification Search
CPC . H01L 23/5283; H01L 27/0688; H10B 20/50; H10B 41/20; H10B 41/27; H10B 41/50; H10B 43/20; H10B 43/27; H10B 43/50; H10B 51/20; H10B 53/20
See application file for complete search history.

(56) References Cited

U.S. PATENT DOCUMENTS

| 8,759,217 B1 | 6/2014 | Chen |
| 9,589,978 B1 | 3/2017 | Yip |

(Continued)

OTHER PUBLICATIONS

Luo et al., Microelectronic Devices with Multiple Step Contacts Extending to Stepped Tiers, and Related Systems and Methods, U.S. Appl. No. 17/476,344, filed Sep. 15, 2021, 79 pages.
(Continued)

*Primary Examiner* — Ida M Soward
(74) *Attorney, Agent, or Firm* — TraskBritt

(57) ABSTRACT

Microelectronic devices include a stack structure having a vertically alternating sequence of insulative structures and conductive structures arranged in tiers. A series of stadiums, within the stack structure, includes stadiums of differing numbers of staircase sets, such as a stadium having multiple parallel sets of staircases and an additional stadium having a single set of staircases. Each of the staircases includes steps, at ends of the conductive structures, with a same multi-tier riser height. In methods of fabrication, a same initial stadium opening may be concurrently formed for each of the stadiums—regardless of whether the stadium is to include the single set or the multiple parallel sets of staircases—with the steps of the same multi-tier riser height. Electronic systems are also disclosed.

20 Claims, 19 Drawing Sheets

(51) Int. Cl.
*H01L 23/522* (2006.01)
*H01L 23/528* (2006.01)
*H10B 20/00* (2023.01)
*H10B 41/20* (2023.01)
*H10B 41/27* (2023.01)
*H10B 41/50* (2023.01)
*H10B 43/20* (2023.01)
*H10B 43/27* (2023.01)
*H10B 51/20* (2023.01)
*H10B 53/20* (2023.01)
*H10D 88/00* (2025.01)

(52) U.S. Cl.
CPC .............. *H10B 43/27* (2023.02); *H10B 51/20* (2023.02); *H10B 53/20* (2023.02); *H10D 88/00* (2025.01)

(56) References Cited

U.S. PATENT DOCUMENTS

| | | | |
|---|---|---|---|
| 9,779,948 | B1 | 10/2017 | Baraskar et al. |
| 10,043,818 | B2* | 8/2018 | Lee ................ H10B 43/50 |
| 10,204,919 | B2* | 2/2019 | Lee .................. H01L 27/0207 |
| 10,373,970 | B2 | 8/2019 | Lee |
| 10,615,169 | B2 | 4/2020 | Van et al. |
| 10,818,681 | B2 | 10/2020 | Hu et al. |
| 10,847,526 | B1* | 11/2020 | Yip ................. H10B 41/27 |
| 10,879,175 | B2 | 12/2020 | Tessariol et al. |
| 10,910,395 | B2 | 2/2021 | Lee |
| 10,978,478 | B1 | 4/2021 | Yip |
| 11,088,017 | B2 | 8/2021 | Matovu et al. |
| 11,088,088 | B2 | 8/2021 | Jhothiraman et al. |
| 2013/0219803 | A1* | 8/2013 | Ruhmann ............ E04H 3/12 52/8 |
| 2015/0228623 | A1* | 8/2015 | Oh ..................... H10B 63/84 257/315 |
| 2016/0372322 | A1* | 12/2016 | Oh ..................... H01L 21/30604 |
| 2017/0256551 | A1 | 9/2017 | Lee |
| 2017/0263556 | A1* | 9/2017 | Tessariol ............. H10B 43/50 |
| 2017/0294383 | A1* | 10/2017 | Tanzawa ............ H10B 43/27 |
| 2019/0081061 | A1 | 3/2019 | Tessariol et al. |
| 2019/0371728 | A1 | 12/2019 | Gossman et al. |
| 2020/0091081 | A1 | 3/2020 | Hatazaki et al. |
| 2020/0251491 | A1* | 8/2020 | Ozawa ................ H01L 21/0274 |
| 2020/0357813 | A1 | 11/2020 | Tanzawa |
| 2021/0050357 | A1 | 2/2021 | Yip |
| 2021/0134825 | A1 | 5/2021 | Liu et al. |
| 2021/0143169 | A1* | 5/2021 | Lee .................. H10B 41/27 |
| 2021/0151455 | A1 | 5/2021 | Xu et al. |
| 2021/0257298 | A1 | 8/2021 | Xu et al. |
| 2021/0343637 | A1* | 11/2021 | Clampitt ............. H10B 43/35 |
| 2022/0068827 | A1* | 3/2022 | Jain .................. H10B 43/35 |
| 2022/0130954 | A1* | 4/2022 | Luo ................... H01L 23/53295 |
| 2022/0181342 | A1* | 6/2022 | Vadivel ............. H10B 41/50 |
| 2022/0189982 | A1* | 6/2022 | Luo ................... H10B 43/10 |
| 2022/0199637 | A1* | 6/2022 | Luo ................... H10B 43/50 |
| 2022/0285378 | A1* | 9/2022 | Larsen ............... H01L 23/5384 |
| 2023/0010799 | A1* | 1/2023 | Xu .................... H10B 43/10 |
| 2023/0063111 | A1* | 3/2023 | Luo ................... H01L 21/76816 |
| 2023/0063178 | A1* | 3/2023 | Zhao ................. H01L 21/76816 |
| 2023/0178488 | A1* | 6/2023 | Luo ................... H01L 21/76834 257/614 |
| 2023/0197608 | A1* | 6/2023 | Clampitt ............ H10B 41/27 257/773 |
| 2023/0207470 | A1* | 6/2023 | Luo ................... H10B 43/40 257/314 |
| 2023/0276620 | A1* | 8/2023 | Zhang ............... H10B 43/35 257/314 |
| 2023/0307350 | A1* | 9/2023 | Xu .................... H01L 23/535 |
| 2024/0074197 | A1* | 2/2024 | Zhang .............. H01L 21/76816 |

OTHER PUBLICATIONS

Moyer, How It's Built: Micron/Intel 3D NAND, EE Journal (available at https://www.eejournal.com/article/20160201-micron/), Feb. 1, 2016, 9 pages.

Xu et al., Microelectronic Devices with Active Source/Drain Contacts in Trench in Symmetrical Dual-Block Structure, and Related Systems and Methods, U.S. Appl. No. 17/378,258, filed Jul. 12, 2021, 73 pages.

\* cited by examiner

MICROELECTRONIC DEVICES WITH DIFFERENT STAIRCASED STADIUMS HAVING CONSISTENT MULTI-TIER STEP RISER HEIGHT, AND RELATED SYSTEMS AND METHODS

TECHNICAL FIELD

Embodiments of the disclosure relate to the field of microelectronic device design and fabrication. More particularly, the disclosure relates to microelectronic devices (e.g., memory devices, such as 3D NAND memory devices) with series of staircased stadiums formed in a tiered stack of conductive structures vertically alternating with insulative structures. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically-alternate-alternates conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source structure (e.g., a source plate, a source line). A 3D NAND memory device also includes electrical connections between, e.g., access lines (e.g., word lines) and other conductive structures of the device so that the memory cells of the vertical strings can be selected for writing, reading, and erasing operations.

Some 3D NAND memory devices include so-called "staircase" structures having "steps" (or otherwise known as "stairs") at edges (e.g., ends) of the tiers of the stack. The steps have treads (e.g., upper surfaces) defining contact regions of conductive structures of the device, such as of access lines (e.g., word lines), which may be formed by the conductive materials of the tiered stack. Contact structures may be formed in physical contact with the steps to provide electrical access to the conductive structures (e.g., word lines) associated with the steps. The contact structures may be in electrical communication, via conductive routing lines, to additional contact structures that communicate to a source/drain region. String drivers drive the access line (e.g., word line) voltages to write to or read from the memory cells controlled via the access lines (e.g., word lines).

A continued goal in the microelectronic device fabrication industry is to minimize the footprint of the features of microelectronic devices so as to maximize the number of devices, and functional features thereof, in a given structural area. However, as device and feature sizes are reduced (e.g., scaled to smaller sizes), precise and accurate fabrication tends to involve numerous and/or complex processing stages, which tend to increase the cost of fabrication. Accordingly, designing and fabricating 3D NAND memory devices continues to present challenges.

DETAILED DESCRIPTION

Figure 1:
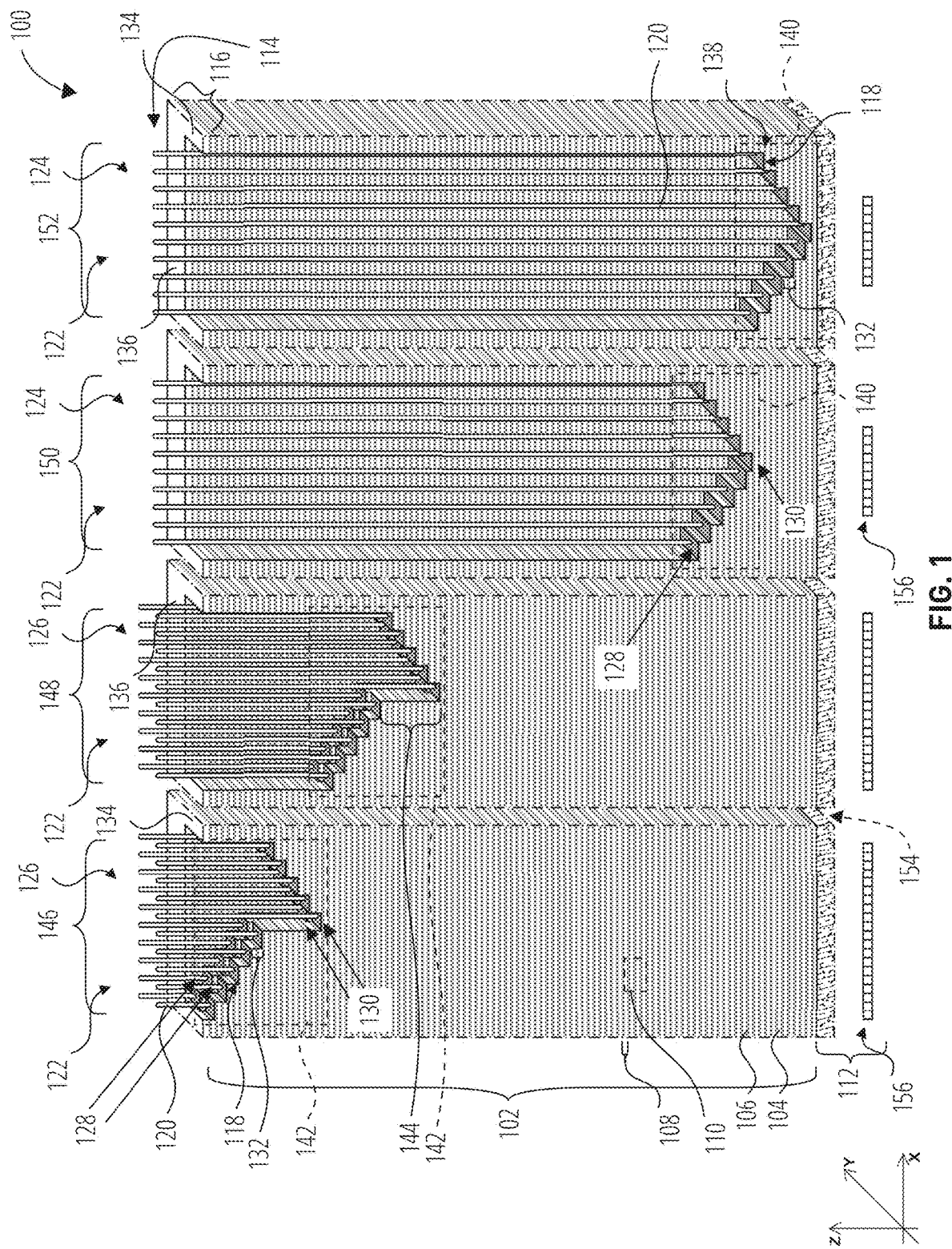
FIG. 1 is a schematic, cross-sectional, perspective view of a microelectronic device structure of a microelectronic device, according to embodiments of the disclosure.

Structures (e.g., microelectronic device structures), apparatuses (e.g., microelectronic devices), and systems (e.g., electronic systems), according to embodiments of the disclosure, include a stack of vertically alternating conductive structures and insulative structures arranged in tiers. A series of stadiums is patterned into the tiered stack with non-patterned "crest" portions of the stack spacing neighboring stadiums from one another. The stadiums include staircase structures having steps at ends of stepped tiers of the stack. The steps include treads defined by upper horizontal surfaces of conductive structures of the stepped tiers. In their respective staircases, the steps also include risers defined by vertical sidewalls, at the distal end of the treads, of multiple of the tiers (e.g., multiple of the conductive structures and multiple of the insulative structures). A conductive "step contact" (e.g., access line contact, word line contact) extends to each step of the staircases. At least some stadiums of the series, which may be relatively shallower stadiums, each include multiple parallel sets of staircases to facilitate a relatively greater number of steps in—and a relatively greater number of step contacts to—each such stadium. At least some other stadiums of the series, which may be relatively deeper stadiums, each include a single set of staircases. The simpler structures of the single-set stadiums, compared to the multi-set stadiums, facilitates accurate formation of the single-set stadiums deep in the tiered stack, at the base of high-aspect-ratio stadium openings. The steps of the staircases in both types of stadiums define a same riser height of a multiple number of tiers (e.g., two tiers), which consistent riser height facilitates fabrication efficiencies such as enabling concurrent formation of the initial stadium openings for all stadium areas. Accordingly, the stadium structures provide not only feature scaling and structural efficiencies, but also fabrication efficiencies and lower costs.

As used herein, the term "series of stadiums" means and refers to a group of stadiums distributed across a stack structure in a row (e.g., in the illustrated X-axis direction), with neighboring stadiums spaced from one another by a non-patterned "crest" portion of the stack.

As used herein, the term "set of staircases" means and refers to one or more staircases that collectively define a row (e.g., in the illustrated X-axis direction) of steps, each of which steps may be at a respectively different tier elevation of a stack structure. A respective "set of staircases" may include one or more descending staircases, one or more ascending staircases, or any combination thereof.

As used herein, the term "descending staircase" means and refers to a staircase generally exhibiting negative slope, as defined by a phantom line extending from a vertically highest step of the staircase to a vertically lowest step of the staircase.

As used herein, the term "ascending staircase" means and refers to a staircase generally exhibiting positive slope, as defined by a phantom line extending from a vertically highest step of the staircase to a vertically lowest step of the staircase.

As used herein, the term "high-aspect-ratio" means and refers to a height-to-width (e.g., a ratio of a maximum height to a maximum width) of greater than about 10:1 (e.g., greater than about 20:1, greater than about 30:1, greater than about 40:1, greater than about 50:1, greater than about 60:1, greater than about 70:1, greater than about 80:1, greater than about 90:1, greater than about 100:1).

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the terms "opening," "trench," and "slit" mean and include a volume extending through or into at least one structure or at least one material, leaving a gap in that at least one structure or at least one material, or a volume extending between structures or materials, leaving a gap between the structures or materials. Unless otherwise described, an "opening," "trench," and/or "slit" is not necessarily empty of material. That is, an "opening," "trench," or "slit" is not necessarily void space. An "opening," "trench," or "slit" formed in or between structures or materials may comprise structure(s) or material(s) other than that in or between which the opening is formed. And, structure(s) or material(s) "exposed" within an opening, trench, or slit is/are not necessarily in contact with an atmosphere or non-solid environment. Structure(s) or material(s) "exposed" within an opening, trench, or slit may be adjacent or in contact with other structure(s) or material(s) that is/are disposed within the opening, trench, or slit.

As used herein, the terms "substrate" and "base structure" mean and include a base material or other construction upon which components, such as tiered stacks and structures therein, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "insulative" and "insulating," when used in reference to a material or structure, means and includes a material or structure that is electrically insulative or electrically insulating. An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative" or "insulating" structure means and includes a structure formed of and including "insulative" or "insulating" material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the whole of the material or structure in question or of a concerned portion of the material or structure in question. For example, a width of a conductive structure may be a maximum X-axis dimension from one lateral end of the conductive structure to an opposite lateral end of the structure, whereas a width of a step defined by the conductive structure may be a maximum X-axis dimension of only that portion of the conductive structure that provides the step.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question or of a concerned portion of the material or structure in question. For example, a length of a conductive structure may be a maximum Y-axis dimension from one block-defining slit to another block-defining slit, whereas a length of a step defined by the conductive structure may be a maximum Y-axis dimension of only that portion of the conductive structure that provides the step.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, features (e.g., regions, materials, openings, structures, assemblies, devices) described as "neighboring" one another mean and include features of the disclosed identity (or identities) that are located most proximate (e.g., closest to) one another. One or more additional features (e.g., additional regions, additional materials, additional structures, additional openings, additional assemblies, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with the "neighboring" features is positioned between the "neighboring" features. For example, a structure of material X "neighboring" a structure of material Y is the first material X structure, e.g., of multiple material X structures, that is nearest the particular structure of material Y. Accordingly, features described as "vertically neighboring" one another mean and include features of the disclosed identity (or identities) that are located most vertically proximate (e.g., vertically closest to) one another. Moreover, features described as "horizontally neighboring" one another mean and include features of the disclosed identity (or identities) that are located most horizontally proximate (e.g., horizontally closest to) one another.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" heights as one another may each define a same, substantially same, or about the same height, from a lower surface to an upper surface of each respective such structure, despite the two structures being at different elevations of a larger structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure (e.g., stack structure) that includes the materials or features. When used with reference to the drawings, a "depth" is defined by a horizontal plane parallel to the highest illustrated surface of the structure (e.g., stack structure) that includes the materials or features.

Unless otherwise specified, any spatially relative terms used in this disclosure are intended to encompass different orientations in addition to the orientation as depicted in the drawings. For example, the materials in the drawings may be inverted, rotated, etc., with the "upper" levels and elevations then illustrated proximate the bottom of the page, the "lower" levels and elevations then illustrated proximate the top of the page, and the greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced feature (e.g., region, material, structure, opening, assembly, device) so as to facilitate a referenced operation or property of the referenced feature in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated is a microelectronic device structure 100 that includes a stack 102 (which may otherwise be referred to herein as a "stack structure" or as a "tiered stack") of vertically alternating (e.g., vertically interleaved) insulative structures 104 and conductive structures 106 arranged in tiers 108. Each tier 108—as the term "tier" is used herein—includes one of the insulative structures 104 and one of the conductive structures 106 vertically neighboring the one of the insulative structures 104. This vertically alternating, interleaved arrangement of the insulative structures 104 and the conductive structures 106 providing the tiers 108 is illustrated in greater detail in FIG. 2, which is an enlargement of area box 110 of FIG. 1, but may be equally illustrative of other portions of the stack 102.

With continued reference to FIG. 1, the number (e.g., quantity) of tiers 108 (and conductive structures 106) illustrated is for example only, and the disclosure is not so limiting. For example, a microelectronic device structure, in accordance with embodiments of the disclosure, may include a different quantity of the tiers 108 (e.g., and of the conductive structures 106) in the stack 102. In some embodiments, the stack 102 includes one-hundred twenty-six or one-hundred twenty-eight of the tiers 108 (and of the conductive structures 106). The number (e.g., quantity) of the tiers 108—and therefore of the conductive structures 106—of the stack 102 may be within a range of from thirty-two to three-hundred or more. The tiers 108 may be included in one or more decks of the stack 102.

The conductive structures 106 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof), at least one conductively-doped semiconductor material (e.g., conductively-doped silicon, conductively-doped germanium, conductively-doped silicon germanium), polysilicon, and at least one other material exhibiting electrical conductivity. In some embodiments, the conductive structures 106 include at least one of the aforementioned conductive materials along with at least one additional of the aforementioned conductive materials formed as a liner. Some or all of the conductive structures 106 may have the same (e.g., consistent) or different thicknesses (e.g., heights) as one another.

The insulative structures 104 may be formed of and include (e.g., each be formed of and include) at least one insulative material, such as a dielectric oxide material (e.g., silicon dioxide). In this and other embodiments described herein, the insulative material of the insulative structures 104 may be substantially the same as or different than other insulative material(s) of the microelectronic device structure 100. Some or all of the insulative structures 104 may have the same (e.g., consistent) or different thicknesses (e.g., heights) as one another. In some embodiments, some of the insulative structures 104 (e.g., an uppermost, a lowest, and/or intermediate insulative structures 104) are relatively thicker than others of the insulative structures 104 in the stack 102.

The stack 102 may be provided on or over a base structure 112, which may include one or more regions formed of and including, for example, one or more semiconductor materials (e.g., polycrystalline silicon (polysilicon)) doped with one or more P-type conductivity chemical species (e.g., one or more of boron, aluminum, and gallium) and/or one or more N-type conductivity chemical species (e.g., one or more of arsenic, phosphorous, and antimony) to provide one or more source/drain regions of the microelectronic device structure 100.

In addition to the semiconductor materials and/or source/drain region, the base structure 112 may include other base material(s) or structure(s), such as conductive regions for making electrical connections with other conductive structures of the device that includes the microelectronic device structure 100. In some such embodiments, CMOS (complementary metal-oxide-semiconductor) circuitry is included, within the base structure 112, in a CMOS region below the source/drain region, which CMOS region may be characterized as a so-called "CMOS under Array" ("CuA") region.

Figure 3:
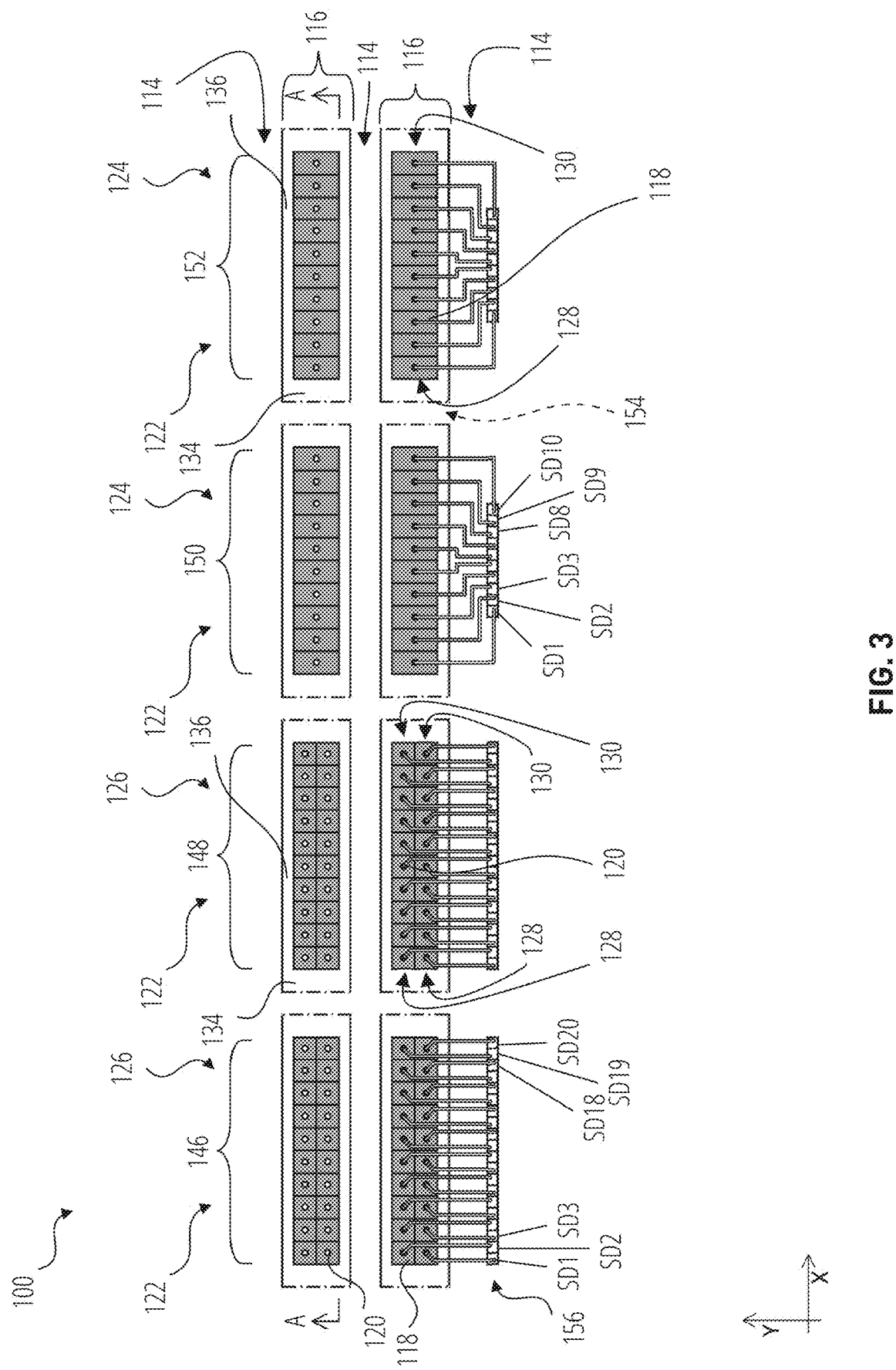
FIG. 3 is a top plan, schematic view of the microelectronic device structure of FIG. 1, wherein the front of FIG. 1 corresponds to a view from section line A-A of FIG. 3.

With continued reference to FIG. 1 and also with reference to FIG. 3—which is a top plan view of the microelectronic device structure 100 of FIG. 1—a series of slits 114 or other elongate structures may extend through the stack 102 to divide the stack 102 into a series of blocks 116 that extend in the lateral direction (e.g., with a greater dimension (e.g., width) in the "X"-axis direction than a dimension (e.g., length) in the "Y"-axis direction). FIG. 3 is a top plan view of a pair of neighboring blocks 116 including the block 116 illustrated in FIG. 1. As illustrated in FIG. 3, a pair of slits 114 may be formed, parallel to the "X"-axis, to define the front and rear of a respective one of the blocks 116 of the microelectronic device structure 100. A longitudinally forward and/or rearward neighboring block 116, to the block 116 of FIG. 1, may be similarly structured to the block 116 of FIG. 1 such that the illustration of FIG. 1 may represent such neighboring blocks 116 as well. Alternatively, such neighboring blocks 116 may have structures substantially mirrored to that of the block 116 of FIG. 1, reflected about the slit 114 that separates the blocks 116 from one another. The slits 114 may be substantially filled with non-conductive material(s).

Other portions of the microelectronic device structure 100 (e.g., portions horizontally disposed relative to the portions illustrated in, e.g., FIG. 1 and FIG. 3) may include array(s) of pillars (e.g., including channel material and memory material) extending through the stack 102 and to and/or into the base structure 112 (e.g., to and/or into a source/drain region). The pillars may effectuate the formation of strings of memory cells of a memory device (e.g., a memory device including any of the microelectronic device structures described or illustrated herein). The conductive structures 106 of the tiers 108 may be coupled to, or may form control gates of, the memory cells effectuated by the pillars. For example, each conductive structure 106 may be coupled to an individual memory cell of a particular string (e.g., effectuated by a particular pillar) of memory cells.

To facilitate electrical communication to particular selected conductive structures 106 within the stack 102, conductive contact structures extend to (or from) and physically contact the conductive structures 106 of the tiers 108. Each such conductive contact structure is positioned to physically contact a particular one of the conductive structures 106 at a step 118 that includes a tread in the form of an exposed upper (e.g., horizontal) surface portion of one of the conductive structures 106. The tread of the step 118 functions as a landing area for physical contact with one of the conductive contact structures, which are referred to herein as "step contacts" 120.

Still referring to FIG. 1, one or more insulative fill material(s) (e.g., dielectric material(s)) may substantially fill remaining openings (e.g., trenches), referred to herein as "stadium openings" (e.g., "stadium trenches") vertically overlying and partially defined by the stadiums 122 (e.g., single-set stadiums 124, multi-set stadiums 126) to electrically insulate the step contacts 120 from one another. The step contacts 120 vertically extend through the insulative fill material(s) to the steps 118. For ease of illustration, FIG. 1 and FIG. 3 do not illustrate the insulative fill material(s). In some embodiments, the insulative fill material(s) may be one or more dielectric material(s) formed of and including any one or more insulative materials described above.

With continued reference to FIG. 1, to provide the steps 118 of the conductive structures 106, the stack 102 is patterned (e.g., etched) to expose one or more upper (e.g., horizontal) surface area portion(s) of individual conductive structures 106. That is, the tiers 108 are selectively patterned to remove portions of otherwise-overlying tiers 108 to leave exposed (until otherwise covered by fill material and/or step contacts 120) at least one upper surface area of the conductive structure 106 of the next lower tier 108. Each exposed area provides one step 118 for the respective tier 108 (and conductive structure 106).

Because individual conductive structures 106 in the stack 102 occupy different elevations of the stack 102 (also referred to herein as different "tier elevations"), the steps 118 are formed at the various elevations of the conductive structures 106, and the step contacts 120 extend downward to physically contact (e.g., "land on") respective steps 118. The height of an individual step contact 120 may be tailored according to the depth (e.g., elevation) of its respective step 118. The step contacts 120 extending to steps 118 of relatively shallower stadiums 122, e.g., in the relatively higher elevations of the stack 102, may be generally shorter than the step contacts 120 that extend to steps 118 of relatively deeper stadiums 122, e.g., in relatively lower elevations of the stack 102. The microelectronic device structure 100 may include, in each respective block 116, at least one step contact 120 per step 118 and, therefore, at least one step contact 120 per tier 108 (e.g., and therefore per conductive structure 106) in the stack 102.

The steps 118 are grouped in staircases with each staircase providing at least a part of a row (extending in the X-axis direction) of the steps 118, all or at least some of which are at different tier elevations than others of the steps 118 in the staircase. The tier elevations of the steps 118 of a respective staircase may incrementally decrease or incrementally increase through the staircase according to a "riser height" 132. For example, in one staircase, the steps 118 may be formed at successively increasing tier 108 (and conductive structure 106) depths (e.g., decreasing tier 108 elevations) to define a descending staircase 128 having generally negative slope. In another staircase, the steps 118 may be formed at successively decreasing tier 108 (and conductive structure 106) depths (e.g., increasing tier 108 elevations) to define an ascending staircase 130 having generally positive slope. The elevation difference between neighboring steps 118 of the row of steps 118 of a respective staircases (e.g., one of the descending staircases 128, one of the ascending staircases 130) defines the riser height 132.

The staircases (e.g., the descending staircases 128 and the ascending staircases 130) are grouped in so-called "stadiums" 122. Each set of staircases extends the width of each stadium 122. As used herein, a "set" of staircases comprises the one or more staircases that are horizontally aligned in the x-axis direction within a respective stadium 122 and that extend the width of the stadium 122.

In some embodiments, one set of staircases consists of a single (e.g., only one) descending staircase 128 and a single (e.g., only one) ascending staircase 130, such as in the microelectronic device structure 100 illustrated in FIG. 1. In some embodiments, the descending staircase 128 descends toward the ascending staircase 130, as illustrated in FIG. 1. In other embodiments, the ascending staircase 130 ascends toward the descending staircase 128 (such as if the illustrated lateral halves of the stadiums 122 of FIG. 1 were horizontally reversed with one another). In other embodiments, one set of staircases consists of a single descending staircase 128 or a single ascending staircase 130 that extends the whole width of the stadium 122. In other embodiments, more than one descending staircase 128 may be included in the set, alone with one or more ascending staircases 130; or more than one ascending staircase 130 may be included in the set, alone or with one or more descending staircases 128.

The stadiums 122, of a respective block 116 of the microelectronic device structure 100, may be arranged in a series such that multiple stadiums 122 are distributed across a width of the block 116 and extend, in a row (e.g., in the X-axis direction), substantially parallel to the slits 114, as illustrated in FIG. 1 and FIG. 3. The microelectronic device structure 100 may include as many stadiums 122 at various elevation groups, within a respective block 116 (and stadium series), as necessary to include at least one step 118 per tier 108 (and per conductive structure 106) of the stack 102.

Neighboring stadiums 122 may be spaced from one another, in the stadium series of the block 116, by a so-called "crest" 134 of the stack 102. The crests 134 may be formed by areas of the stack 102 where the tiers 108 have not been patterned. The crests 134 may, therefore, extend an entire height of the stack 102. In some embodiments, uppermost boundaries of the crests 134 may be positioned at (e.g., coplanar with) uppermost boundaries of the stack 102. In some embodiments, through-stack conductive structures may be included in the crests 134 and may be in electrical communication between the step contacts 120 and other electrical components in the base structure 112.

One or more other non-patterned portions of the stack 102 may form a so-called "bridge" 136 that extends a width of the block 116. The bridge(s) 136 may extend the entire height of the stack 102. In some embodiments, uppermost boundaries of the bridge(s) 136 may be positioned at (e.g., coplanar with) uppermost boundaries of the stack 102. The bridge 136 may border one of the slits 114 that define the block 116 length (Y-axis dimension). In some embodiments, each block 116 includes two bridges 136, and each bridge 136 borders a different one of the slits 114 that define the block 116, as illustrated in FIG. 3. Via the one or more bridges 136, distal portions of a given conductive structure 106 of a respective tier 108 are part of a continuous, single conductive structure 106 of that tier 108. Therefore, an electrical connection between one or more of the step contacts 120 and one of the steps 118 may provide an electrical connection between the one or more step contacts 120 and the whole of the conductive structure 106—that provides the step 118 of the respective stepped tier 138—throughout the block 116.

As used herein, a "stepped tier" means and refers to a tier 108 of the stack 102 that includes a conductive structure 106 with at least one exposed upper surface providing at least one step 118 (e.g., at least one landing area for the conductive structure 106 of the tier 108).

At least one of the stadiums 122 of the series in the block 116 includes a single set of staircases and so is referred to herein as "single-set stadium" 124. In such single-set stadiums 124, each step 118 tread may span the whole length (Y-axis dimension) of the stadium 122 from bridge 136 to bridge 136, as most easily seen in the top plan illustration of FIG. 3. The set of staircases defines a single row of steps 118 in the single-set stadium 124, and a single row of step contacts 120 may extend to the steps 118 of the single-set stadium 124.

Figure 4:
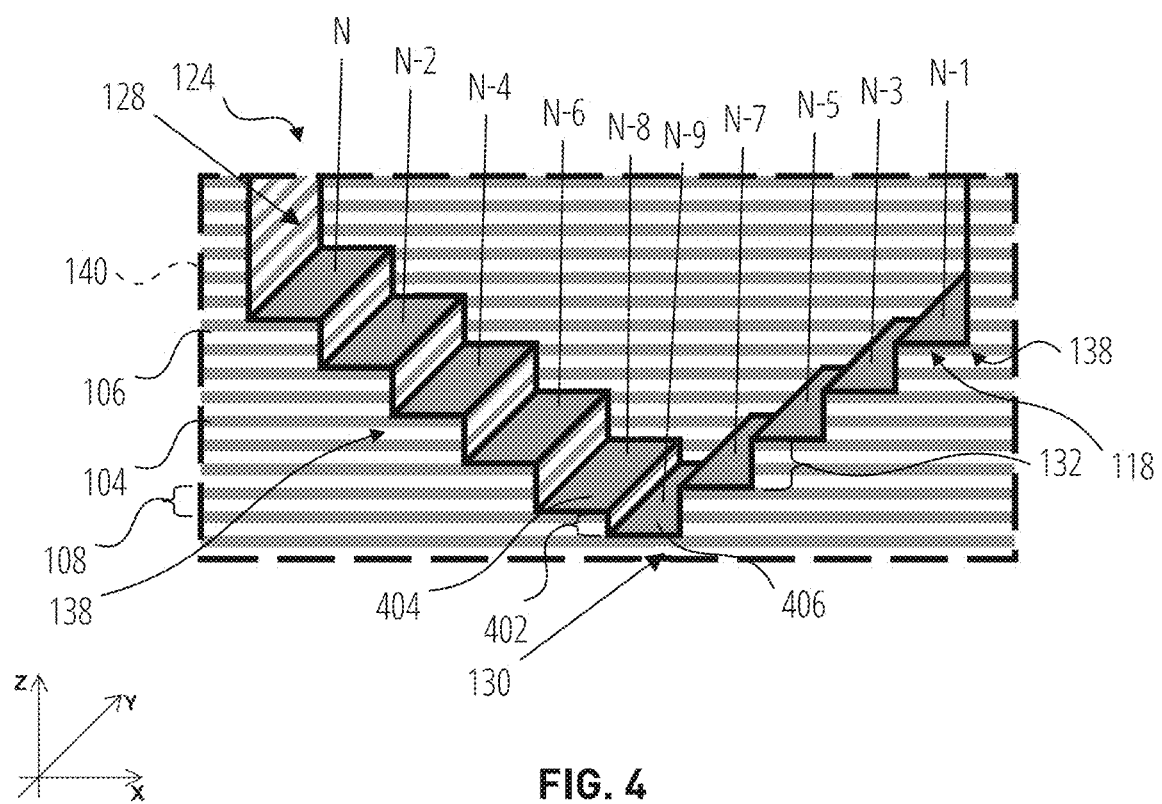
FIG. 4 is an enlarged view of the area of box 140 of FIG. 1, illustrating a single-set stadium, according to embodiments of the disclosure.

The staircase profile of the single-set stadium 124 is illustrated in an enlarged view of FIG. 4, which corresponds to boxes 140 of FIG. 1, though without illustrating the step contacts 120 for better visibility. The single-set stadium 124 may include a single descending staircase 128 and a single ascending staircase 130 (collectively the single "set" of staircases of the single-set stadium 124) that together provide a series of steps 118 with each step 118 occupying a unique tier elevation.

Each of the steps 118 may define a same riser height 132, of a multiple number of the tiers 108 of the stack 102, within its respective staircase (e.g., within the descending staircase 128, within the ascending staircase 130). For example, in some embodiments, the riser height 132 may be selected to be a height of two tiers 108, and each subsequent step 118 of the descending staircase 128 may be at an elevation that is the riser height 132 of two tiers 108 (i.e., two conductive structures 106 plus two insulative structures 104) lower than its preceding step 118. Therefore, the descending staircase 128 defines steps 118 at elevations N, N-2, N-4, N-6, and N-8, as illustrated in FIG. 4. Within the same example, each subsequent step 118 of the ascending staircase 130 may be at an elevation that is the riser height 132 of two tiers 108 higher than its preceding step 118. Therefore, the ascending staircase 130 defines steps 118 at elevations N-9, N-7, N-5, N-3, and N-1.

The particular riser height 132 selected for the steps 118 of the single-set stadium 124 may be selected to be the same as the riser height 132 for the steps 118 in other stadiums 122 of the block 116, as discussed further below.

To ensure the steps 118 of the descending staircase 128 are at elevations unique from the elevations of the steps 118 of the ascending staircase 130, the two staircases may be offset from one another by a number of tiers 108 that is less than the number of tiers 108 that define the riser height 132. For example, as in FIG. 4, in embodiments in which the riser height 132 is two tiers 108, the ascending staircase 130 may be offset (e.g., lower or higher) than the descending staircase 128 by a one-tier offset 402. Accordingly, the one-tier offset 402 from one staircase to the other (e.g., from the final step 404 of the descending staircase 128 to the initial step 406 of the ascending staircase 130) provides the unique step 118 elevations. In other embodiments, the offset may be a height of other than one tier 108, provided it is less than the riser height 132.

Though FIG. 4 and other figures illustrate the ascending staircase 130—of the single set of staircases in the single-set stadium 124—being the one-tier offset 402 lower than the descending staircase 128, the disclosure is not so limited. In other embodiments, the ascending staircase 130 may be one-tier offset 402 (or some other offset amount that is less than the riser height 132) higher than the descending staircase 128. In such embodiments, the ascending staircase 130 includes the "even elevation" steps 118, e.g., at elevations N, N-2, N-4, N-6, N-8, while the descending staircase 128 includes the "odd elevation" steps 118, e.g., at elevations N-1, N-3, N-5, N-7, N-9.

Other than the one-tier offset 402 separating the elevations of the steps 118 that neighbor one another where the descending staircase 128 meets the ascending staircase 130 (e.g., the final step 404 of the descending staircase 128 and the initial step 406 of the ascending staircase 130), each other step 118 in the set of staircase differs in elevation from that of its neighboring steps 118 by the riser height 132 of the multiple (e.g., two) number of tiers 108. Accordingly, the step-to-step elevation difference within each respective staircase may be the same riser height 132 (e.g., two tiers 108), though the step-to-step elevation difference where neighboring staircases, of the set, meet may be other than the riser height 132 (e.g., may be the one-tier offset 402).

With returned reference to FIG. 1, while at least one of the stadiums 122 of the series is structured as the single-set stadium 124 (FIG. 4), at least one other of the stadiums 122 of the series in the block 116 includes multiple sets of parallel staircases and so is referred to herein as a "multi-set stadium" 126. In such multi-set stadium 126, each step 118 tread may span only a portion (e.g., half) of the whole length (Y-axis dimension) of the stadium 122, as most easily seen in the top plan illustration of FIG. 3. The multiple sets of staircases define multiple rows of steps 118 (one row per set) in the multi-set stadium 126, and multiple rows of step contacts 120 may extend to the steps 118 of the multi-set stadium 126.

With multiple sets of parallel staircases in the multi-set stadium 126, the multi-set stadium 126 provides multiple more (e.g., twice as many) steps 118, and accommodates connection to multiple more (e.g., twice as many) step contacts 120 (FIG. 1), compared to the single-set stadiums 124. Accordingly, though both the multi-set stadium 126 and the single-set stadium 124 may occupy substantially the same respective stadium area (e.g., footprint of the stack 102), multiple (e.g., twice) as many electrical connections may be facilitated by the multi-set stadium 126 as the single-set stadium 124. Therefore, inclusion of the multi-set stadiums 126 may facilitate scaling and device/structural efficiencies, compared to a series of stadiums of only single staircase sets.

Figure 5:
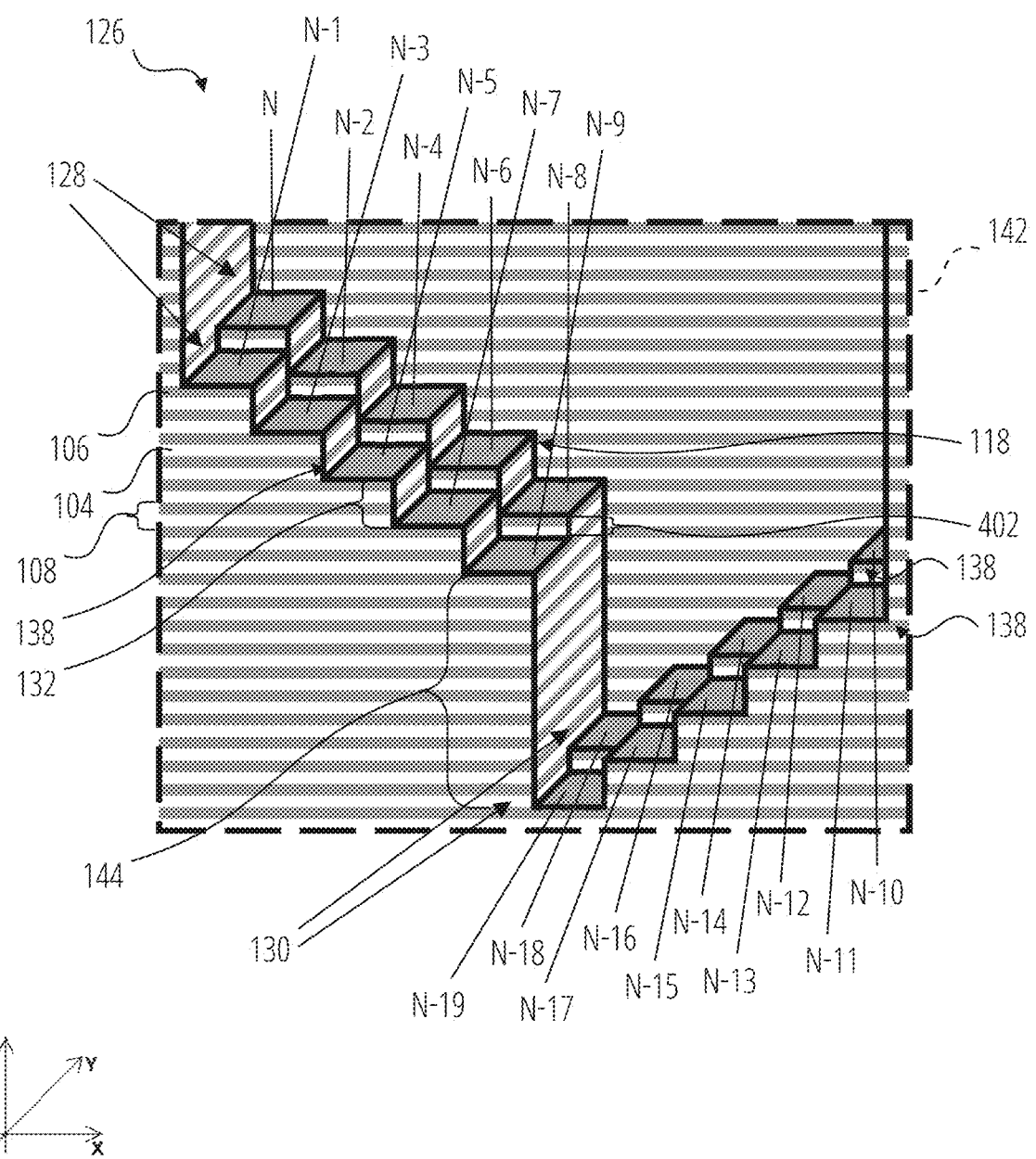
FIG. 5 is an enlarged view of the area of box 142 of FIG. 1, illustrating a multi-set stadium, according to embodiments of the disclosure, wherein step contacts are not illustrated for ease of view.

The staircase profile of the multi-set stadium 126 is illustrated in an enlarged view in FIG. 5, which corresponds to boxes 142 of FIG. 1, though without illustrating the step contacts 120 for better visibility. In some embodiments, the multi-set stadium 126 includes two sets of staircases, with each set being substantially parallel to one another. Each set of staircases may include a single descending staircase 128 and single ascending staircase 130. In other embodiments, more than two sets of parallel staircases may be included, or each set may consist of only a single staircase (e.g., a single ascending staircase 130, a single descending staircase 128).

Each of the steps 118 of the staircases of the multi-set stadium 126 may each occupy a unique tier elevation compared to the other steps 118 of the multi-set stadium 126. To accomplish this, neighboring parallel sets of steps 118 may be vertically offset from one another by at least a height of one tier 108 (e.g., the one-tier offset 402), as also illustrated in FIG. 5. Therefore, for the descending staircases 128, steps 118 at the elevations of N, N-2, N-4, N-6, and N-8 (e.g., in a first descending staircase 128) are each one tier 108 height above steps 118 at the elevations of N-1, N-3, N-5, N-7, and N-9, respectively (e.g., in a second descending staircase 128 parallel the first). Likewise, for the ascending staircases 130, steps 118 at the elevations of N-18, N-16, N-14, N-12, and N-10 (e.g., in a first ascending staircase 130) are each one tier 108 height above steps 118 at the elevations of N-19, N-17, N-15, N-13, and N-11, respectively (e.g., in a second ascending staircase 130 parallel the first).

Within individual multi-set stadiums 126, the vertical offset from one staircase set to its neighboring, parallel staircase set may be substantially the same as the vertical offset, in the single-set stadiums 124, between the staircases of the single staircase set. Accordingly, within individual multi-set stadiums 126 (FIG. 5) of the block 116, there may be the one-tier offset 402 from the uppermost step 118 (at elevation N) of the first descending staircase 128 to the uppermost step 118 (at elevation N-1) of the second descending staircase 128; and, within individual single-set stadiums 124 (FIG. 4) of the same block 116, there may be the same one-tier offset 402 from the final step 404 (at elevation N-8) of the descending staircase 128 to the initial step 406 (at elevation N-9) of the ascending staircase 130. Having the same one-tier offset 402 in both types of stadiums may provide fabrication efficiencies and cost savings, as discussed in further detail below.

Within each staircase, of each set of staircases, of an individual multi-set stadium 126, each step 118 may define the riser height 132. Each subsequent step 118 of each descending staircase 128 may be at an elevation that is a magnitude of the riser height 132 (e.g., two tiers 108) vertically lower than an elevation of its preceding step 118 (e.g., at elevations N, N-2, N-4, N-6, and N-8 for a first one of the descending staircases 128; and at elevations N-1, N-3, N-5, N-7, and N-9 for a second one of the descending staircases 128); and each subsequent step 118 of each ascending staircase 130 may be at an elevation-that-that is the magnitude of the riser height 132 (e.g., the two tiers 108) vertically higher than an elevation of its preceding step 118 (e.g., at elevations N-18, N-16, N-14, N-12, and N-10 for a first one of the ascending staircases 130, which is in the set with the first one of the descending staircases 128; and at elevations N-19, N-17, N-15, N-13, and N-11 for the second one of the ascending staircases 130, which is in the set with the second one of the descending staircases 128).

The riser height 132 is selected to be greater than the vertical offset (e.g., the one-tier offset 402) between neighboring parallel staircase sets. The riser height 132 is also selected so that the elevations of the steps 118 in one of the parallel sets of staircases, of the multi-set stadium 126, is an elevation not occupied by steps 118 in another of the parallel sets of staircases. Therefore, in embodiments with the one-tier offset 402 between neighboring parallel staircase sets, the riser height 132 may be selected to be a two-tier riser height 132. Accordingly, the uppermost step 118 of the first descending staircase 128 is at elevation N; the uppermost step 118 of the second descending staircase 128 is at elevation N-1 (equal to the one-tier offset 402 lower than the uppermost step 118 in the first descending staircase 128); the second step 118 in the first descending staircase 128 is at elevation N-2 (equal to the riser height 132 lower than the uppermost step 118 of that descending staircase 128); the second step 118 in the second descending staircase 128 is at elevation N-3 (equal to the riser height 132 lower than the uppermost step 118 of that descending staircase 128 and equal to the one-tier offset 402 from the second step 118 of the first descending staircase 128), and so-on until a half-stadium offset 144. The related elevations from step 118 to step 118 are similar in the ascending staircases 130, though with relative raise in elevation, rather than relative lowering in elevation.

In embodiments in which each staircase set includes both a descending staircase 128 and an ascending staircase 130, the descending staircase 128 may be offset from the ascending staircase 130 by the half-stadium offset 144, which may be a height of at least the number of tiers 108 in the lower of the two staircases of the set. The half-stadium offset 144 ensures the steps 118 in the staircase set are each at unique tier elevations. For example, if—as in FIG. 5—each staircase includes five steps 118 with the riser height 132 of two tiers 108, then the descending staircase 128 may be vertically above or below the corresponding ascending staircase 130 of the set by the half-stadium offset 144 of at least ten tiers 108 (i.e., five steps 118×two-tier 108 riser height 132 per step 118). Accordingly, the lowermost step 118 of the descending staircase 128 (e.g., the step 118 at elevation N-8 in the first descending staircase 128 and the step 118 at elevation N-9 in the second descending staircase 128) may be the riser height 132 lower than the uppermost step 118 of the corresponding ascending staircase 130 (e.g., the step 118 at elevation N-10 in the first ascending staircase 130 and the step 118 at elevation N-11 in the second ascending staircase 130). The lowest step 118 of the descending staircases 128

(e.g., the lowest step 118 of the second descending staircase 128, at elevation N-9) may be one tier above the uppermost step 118 of the ascending staircases 130 (e.g., the uppermost step 118 of the first ascending staircase 130, at elevation N-10).

Though the figures, like FIG. 4 and FIG. 5, illustrate five steps 118 per staircase, the disclosure is not so limited. Any other number (e.g., quantity) of steps 118 may be included in an individual staircase. For example, an individual staircase may include six, seven, eight, or more than eight of the steps. For an individual stadium 122, the number of steps 118 in the descending staircase 128 thereof may or may not be the same as the number of steps 118 in the ascending staircase 130 thereof.

In other embodiments, each set of parallel staircases in the multi-set stadiums 126 may be provided by a single descending staircase 128 or single ascending staircase 130, rather than each staircase set including at least one descending staircase 128 and at least one ascending staircase 130 together. In such embodiments, the half-stadium offset 144 may be omitted.

The same riser height 132 is used for the steps 118 in both types of stadiums 122 (e.g., in both the single-set stadiums 124 and the multi-set stadiums 126). As discussed in further detail below, using such a consistent riser height 132 in both the single-set stadiums 124 and the multi-set stadiums 126 enables at least certain fabrication acts to be performed concurrently for all stadiums 122, which minimizes fabrication processes and reduces fabrication complexity and cost.

With returned reference to FIG. 1, accurately forming the multi-set stadiums 126 and their relatively more complex and smaller-tread steps 118 may be more challenging for the relatively deeper stadiums 122 of the block 116. That is, it may be relatively more challenging to accurately form and extend, to relatively deeper levels of the stack 102, the staircases of the multi-set stadiums 126 than to accurately form and extend, to the relatively deeper levels of the stack 102, the staircases of the single-set stadiums 124. Accordingly, in some embodiments, such as illustrated in FIG. 1, the multi-set stadium 126 architecture is used for relatively shallower (e.g., relatively elevationally higher) stadiums 122 (e.g., those illustrated in first stadium area 146 and second stadium area 148 of FIG. 1) of the block 116, while the single-set stadium 124 architecture may be used for relatively deeper (e.g., relatively elevationally lower) stadiums 122 (e.g., those illustrated in third stadium area 150 and fourth stadium area 152 of FIG. 1) of the block 116. In some embodiments, the stadiums 122 in the upper about two-thirds of the stack 102 are multi-set stadiums 126, and the stadiums 122 in the lower about one-third of the stack 102 are single-set stadiums 124.

Though FIG. 1 illustrates the second stadium area 148 as being to the right of the first stadium area 146, the third stadium area 150 as being to the right of the second stadium area 148, and the fourth stadium area 152 as being to the right of the third stadium area 150, the disclosure is not so limited.

There may be one or more additional stadiums 122 disposed between the illustrated stadium areas (between the first stadium area 146 and the second stadium area 148, between the second stadium area 148 and the third stadium area 150, between the third stadium area 150 and the fourth stadium area 152), such as in non-illustrated portions generally represented by intermediate regions 154. Additionally or alternatively, one or more additional stadiums 122 may be disposed laterally adjacent to the first stadium area 146 and/or the fourth stadium area 152. Any such additional stadiums 122, whether interspersed with the stadiums 122 illustrated in FIG. 1 or adjacent to the stadiums 122 illustrated in FIG. 1, may be structured as the single-set stadiums 124, the multi-set stadiums 126, or as differently-structured stadiums, such with steps having a different riser height (e.g., a single-tier riser height) than the multi-tier riser height 132 in the single-set stadiums 124 and the multi-set stadiums 126. Any such additional stadiums 122 may also be within the elevations of the stack 102 as illustrated in FIG. 1 or within other elevations of the stack 102 not illustrated in FIG. 1, such as in higher-still elevations of the stack 102 formed over the illustrated tiers 108, or such as in lower-still elevations of the stack 102 formed between the illustrated tiers 108 and the base structure 112.

In some embodiments, the lateral order (e.g., lateral arrangement) of the first stadium area 146, the second stadium area 148, the third stadium area 150, and the fourth stadium area 152 is other than as illustrated. For example, relatively deeper stadiums 122 (third stadium area 150 and fourth stadium area 152) may be to the left side of relatively shallower stadiums 122 (first stadium area 146 and second stadium area 148); and/or one or more relatively deeper stadiums 122 may be laterally between relatively shallower stadiums 122, and/or vice versa.

Figure 6:
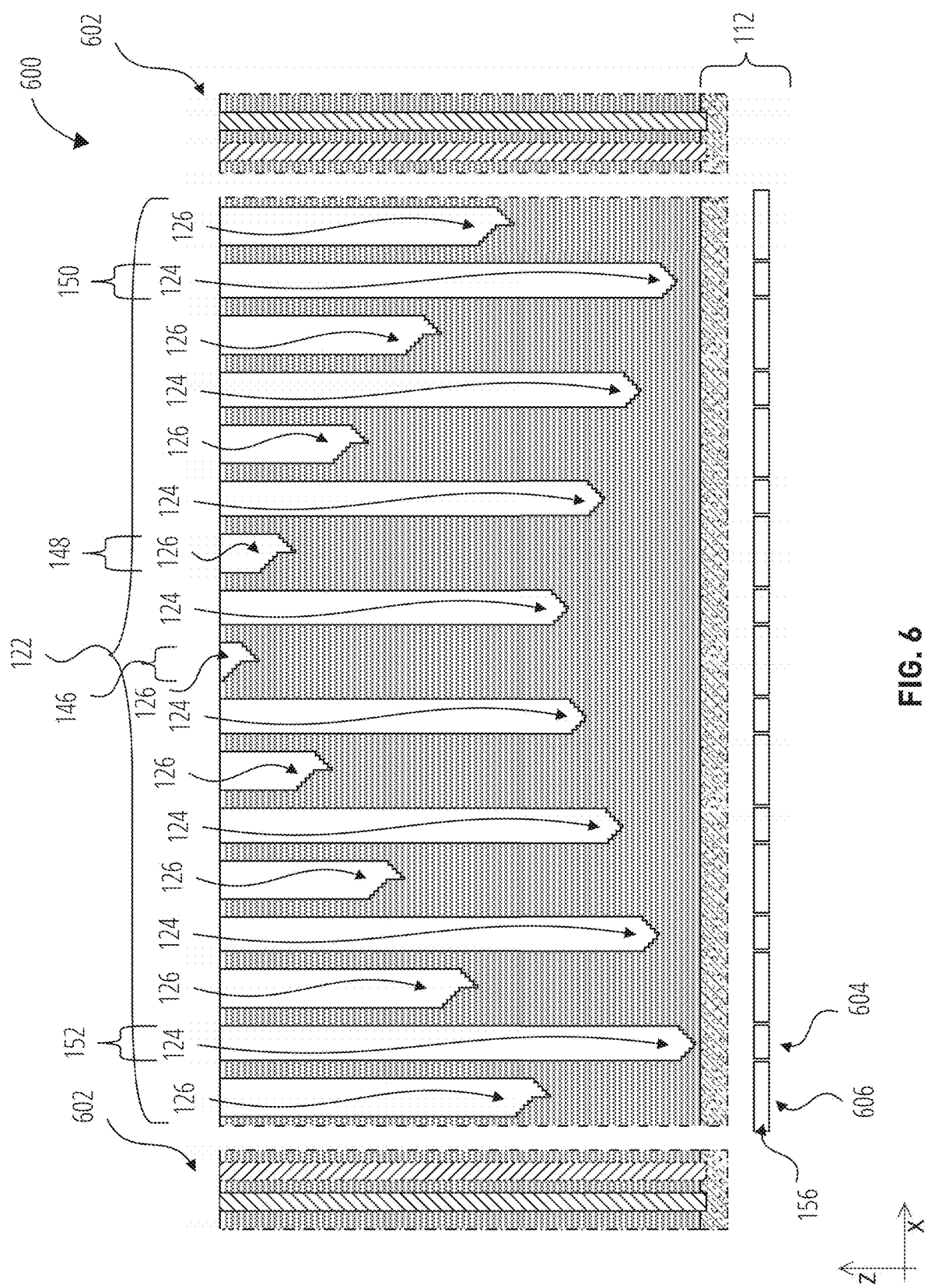
FIG. 6 is a schematic, cross-sectional, elevational front elevational view of a microelectronic device structure that includes a series of stadiums that may include the stadiums illustrated in FIG. 1, including at least one single-set stadium and at least one multi-set stadium, in accordance with embodiments of the disclosure.
Figure 7:
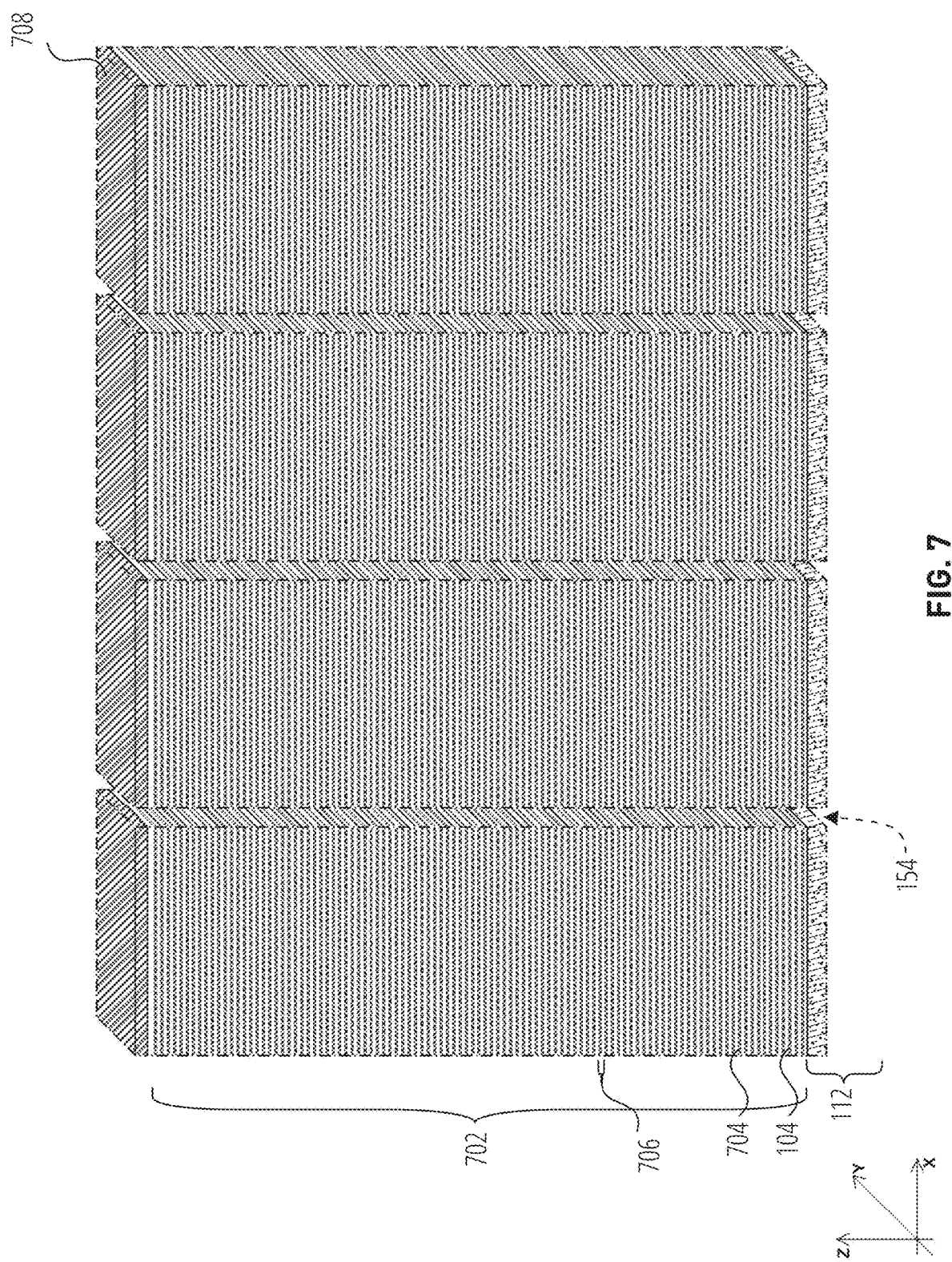
FIG. 7 through FIG. 18 are schematic, cross-sectional, perspective views of various stages of processing to fabricate a microelectronic device structure in accordance with embodiments of the disclosure, such as any of the aforementioned microelectronic device structures.

In some embodiments, such as that illustrated in FIG. 6, a microelectronic device structure 600—which may include the stadiums 122 of the microelectronic device structure 100 of FIG. 1—may be fabricated and structured so that the deeper stadiums 122 of the single-set stadium 124 architecture alternate, across the width of the block 116 (FIG. 1), with the shallower stadiums 122 of the multi-set stadium 126 architecture. Accordingly, the stadiums 122 may be substantially symmetrically distributed across the width of the series of stadiums 122 (e.g., across the width of the block 116 (FIG. 1)) and between array portions 602 disposed to the lateral sides of the stadiums 122 series. The array portions 602 may include the aforementioned array(s) of pillars (e.g., including channel material and memory material) that extend through the stack 102 and effectuate the formation of strings of memory cells. In some embodiments, non-functional (e.g., so-called "dummy") pillars are also included in the array portions 602. For example, dummy pillars may be horizontally between the functional pillars (e.g., forming the strings of memory cells) and the stadiums 122.

With returned reference to FIG. 1, the microelectronic device structure 100 may also include string drivers 156 (e.g., access line drivers, word line drivers) configured to selectively supply access signals, such as programming signals (e.g., programming voltages) to the conductive structures 106 (e.g., to access lines, also known as "word lines") at particular levels of the stack 102 so as to access (e.g., program) the memory cell(s) (e.g., in the array portions 602 (FIG. 6)) that are operatively associated with respective conductive structures 106. There may be one string driver 156 coupled to one respective conductive structure 106 (e.g., access line), such that the microelectronic device structure 100 may include one string driver 156 for each respective stepped tier 138 (e.g., each respective conductive structure 106 that includes at least one step 118).

The string drivers 156 operatively associated with the stepped tiers 138 of a particular block 116 may be disposed below the stack 102 of the block 116, such as in or under the base structure 112, as schematically illustrated in FIG. 1 and FIG. 6. In other embodiments, one or more of the string drivers 156 are disposed above the stack 102 of the block 116, and/or within other areas of the microelectronic device structure 100.

Because the multi-set stadiums 126 include relatively more steps 118 and accommodate relatively more step contacts 120 than the single-set stadiums 124, there may be relatively more string drivers 156 operatively associated with individual multi-set stadiums 126 than with individual single-set stadiums 124.

With returned reference to FIG. 6, in embodiments in which the stadiums 122 are arranged to laterally intersperse the multi-set stadiums 126 with the single-set stadiums 124, string drivers 156 may be efficiently positioned so that the string drivers 604 operatively associated with the single-set stadiums 124 are interspersed with the string drivers 606 operatively associated with the multi-set stadiums 126.

With returned reference to FIG. 3, a series of string drivers 156 is illustrated with electrical connections to corresponding steps 118 in the stadiums 122. The string drivers 156 of FIG. 3 are illustrated as outside of horizontal areas of the blocks 116 for ease of illustration only. The string drivers 156 may be disposed at least partially within horizontal areas of the blocks 116, and they may be positioned vertically underneath the blocks 116, vertically above the blocks 116, or some combination thereof.

The string drivers 156 may be arranged in one or more series (e.g., rows). The sequential order of the string drivers 156 (e.g., SD1, SD2, SD3, ... SD18, SD19, and SD20, for the string drivers 156 associated with the multi-set stadium 126, as illustrated in FIG. 3; and SD1, SD3, SD3, ... SD8, SD9, and SD10, for the string drivers 156 associated with the single-set stadium 124) may not be the same sequential order as the tier elevations of the steps 118 in the respective multi-set stadium 126 or single-set stadium 124. For example, the string drivers 156 (e.g., string drivers 606 (FIG. 6)) for the multi-set stadium 126—e.g., SD1, SD2, SD3, ... SD18, SD19, and SD20—may be in operative communication with the steps 118 at the elevations N-1, N, N-3, N-2, N-5, N-4, N-7, N-6, N-9, N-8, N-18, N-19, N-16, N-17, N-14, N-15, N-12, N-13, N-10, and N-11, respectively (see FIG. 5). Therefore, the first string driver SD1 is not necessarily the string driver 156 that is in operative communication with the first step elevation (e.g., elevation N); the second string driver SD2 is not necessarily the string driver 156 that is in operative communication with the second step elevation (e.g., elevation N-2), etc. Accordingly, the sequential order of the string drivers 156 may not follow the same sequential order as the sequential order of the elevations of the stepped tiers 138 in the corresponding multi-set stadium 126. In other words, the sequential order of the string drivers 156 may differ from the elevational order of the respective, operatively connected steps 118.

As another example, as for the string drivers 156 (e.g., string drivers 604 (FIG. 6)) for the single-set stadium 124—e.g., SD1, SD2, SD3, ... SD8, SD9, SD10—may be in operative communication with the steps 118 at the elevations N, N-2, N-4, N-6, N-8, N-9, N-7, N-5, N-3, and N-1, respectively (see FIG. 4). Therefore, though the first string driver SD1 may be in operative communication with the first step elevation (e.g., elevation N), the second string driver SD2 is not necessarily the string driver 156 that is in operative communication with the second step elevation (e.g., elevation N-1). Rather the last string driver SD10 may be in operative communication with the second step elevation (N-1). Accordingly, also for the single-set stadiums 124, the sequential order of the associated string drivers 156 (e.g., string drivers 604 (FIG. 6)) may not follow the same sequential order of the elevations of the stepped tiers 138.

Accordingly disclosed is a microelectronic device comprising a stack structure. The stack structure comprises a vertically alternating sequence of insulative structures and conductive structures arranged in tiers. A series of stadiums is within the stack structure. The series of stadiums comprises a stadium and an additional stadium. The stadium comprises multiple parallel sets of staircases. The additional stadium comprises a single set of staircases. Each of the staircases, of the multiple parallel sets of staircases and of the single set of staircases, comprises steps at ends of the conductive structures. Each of the steps defines a riser height encompassing vertical thicknesses of multiple of the tiers.

Figure 2:
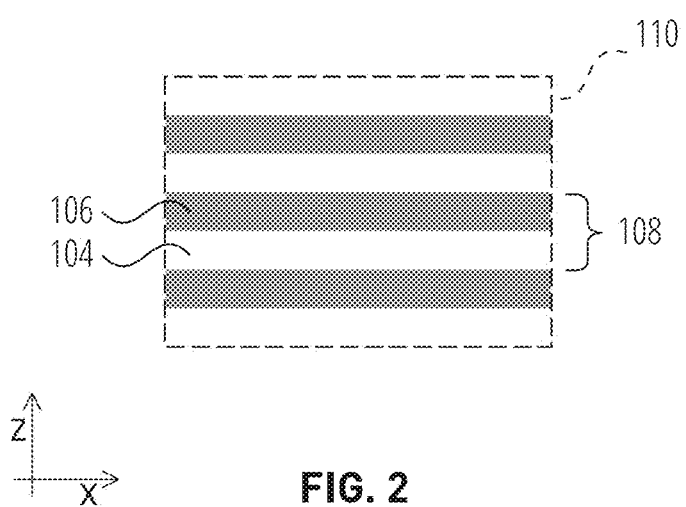
FIG. 2 is an enlarged view of the area of box 110 of FIG. 1.

With reference to FIG. 7 through FIG. 18, illustrated are various stages of forming a microelectronic device, such as one including the microelectronic device structure 100 of FIG. 1 and FIG. 3 and/or the microelectronic device structure 600 of FIG. 6, any of which may include the structures of FIG. 2, FIG. 4, and/or FIG. 5.

A stack 702 (otherwise referred to herein as a "stack structure" or "tiered stack") is formed on the base structure 112, including in areas (e.g., the first stadium area 146, the second stadium area 148, the third stadium area 150, and the fourth stadium area 152 previously described with reference to FIG. 1) in which the stadiums 122 (FIG. 1) will be formed.

In some embodiments, the stack 702 is formed to include a vertically alternating sequence of the insulative structures 104 and sacrificial structures 704 arranged in tiers 706. The sacrificial structures 704 may eventually be replaced with, or otherwise converted into, the conductive structures 106 (e.g., FIG. 1). In other embodiments, the stack 702 may be formed to include the conductive structures 106 instead of the sacrificial structures 704, even without replacement or conversion, such that the stack 702 may have substantially the materials of the stack 102 of FIG. 1. Accordingly, the stack 702 is formed to include the insulative structures 104 and "other structures," which other structures may be either the sacrificial structures 704 or the conductive structures 106.

To form the stack 702, formation (e.g., deposition) of the insulative structures 104 may be alternated with formation (e.g., deposition) of the other structures (e.g., the sacrificial structures 704). In some embodiments, the stack 702 is formed, at this stage, to include as many tiers 706 with the sacrificial structures 704 as there will be tiers 108 (FIG. 1) with conductive structures 106 (FIG. 1) in the final microelectronic device structure (e.g., the microelectronic device structure 100 of FIG. 1 and/or the microelectronic device structure 600 of FIG. 6).

One or more masks 708 (e.g., hardmasks) may also be included on (e.g., above) the stack 702 and utilized in subsequent material-removal (e.g., etching, patterning) processes.

Figure 8:
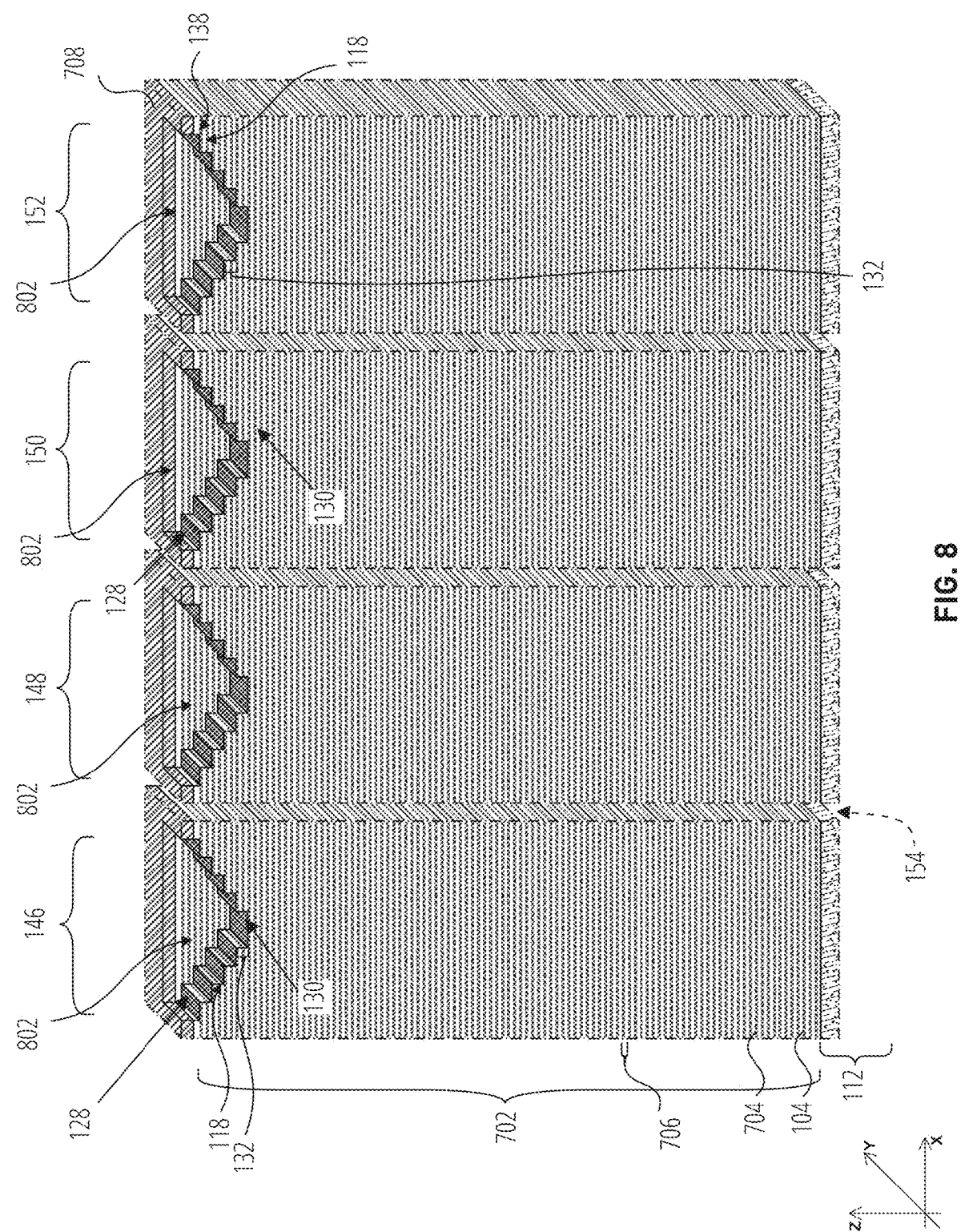

With reference to FIG. 8, the stack 702 (and the mask 708) may be patterned to concurrently form an initial stadium opening 802 in the footprint (e.g., horizontal) area (e.g., the first stadium area 146, the second stadium area 148, the third stadium area 150, the fourth stadium area 152) for each of the stadiums 122 (FIG. 1) to be formed, regardless of whether the stadiums 122 will ultimately be structured as the single-set stadiums 124 (FIG. 4) or the multi-set stadiums 126 (FIG. 5). Areas of the stack 702 for the crests 134 (FIG. 1) and the bridges 136 (FIG. 1) may not be etched so that these portions of the stack 702 retain the full, initial height of the stack 702.

The concurrent formation of the initial stadium openings 802, for both the single-set stadiums 124 (FIG. 4) and the multi-set stadiums 126 (FIG. 5), is facilitated by the use of the same riser height 132 for the steps 118 in both types of stadiums 122 (FIG. 1). Accordingly, each of the initial stadium openings 802 may be substantially the same in staircase profile and elevation. For example, each initial stadium opening 802 may include a single staircase set that includes one descending staircase 128 mirrored by one opposing ascending staircase 130. The steps 118 of the descending staircase 128 may be at substantially the same elevations as the steps 118 of the ascending staircase 130. Each initial stadium opening 802 may be formed in substantially the same uppermost tier 706 elevations of the stack 702.

Forming each of the initial stadium openings 802 may include a sequence of material-removal (e.g., etching) acts by which the mask 708 is patterned to define, for each such initial stadium opening 802, an opening of a first width, which first-width opening is then etched the depth of the riser height 132 (e.g., two tiers 706 deep). Then the mask 708 may be trimmed to expand the opening to a second width, which second-width opening is then patterned the riser height 132 (e.g., two tiers 706 deep), further lowering the first opening to two times the riser height 132 deep. Then, the mask 708 may be trimmed to expand the opening to a third width, which third-width opening is then patterned the riser height 132, further lowering the first opening to a depth of three times the riser height 132 and further lowering the second opening to a depth of two times the riser height 132. This may be repeated until completing the profiles of the initial descending staircase 128 and ascending staircase 130 that are opposing and mirrored.

By utilizing the same riser height 132 for the steps 118 of both types of stadiums and by forming substantially the same initial stadium opening 802 in each of the stadium areas (e.g., the first stadium area 146, the second stadium area 148, the third stadium area 150, and the fourth stadium area 152) the fabrication process avoids separate mask 708 trimming and material-removal acts for the different types of stadiums 122 (FIG. 1) (e.g., the single-set stadiums 124 (FIG. 4) and the multi-set stadiums 126 (FIG. 5)). Therefore, the fabrication process is relatively more efficient, relatively less complex, and relatively less costly compared to a fabrication process involving formation of initial stadium openings of different initial staircase profiles, such as with different riser heights.

As used herein, the term "stadium opening" (e.g., as in the initial stadium openings 802) means and includes an opening that has, along the width (X-axis dimension) of its base, the profiles of the set of staircases (the descending staircase 128 and the ascending staircase 130 of FIG. 8). Accordingly, the initial stadium openings 802 expose surfaces (e.g., steps 118) of the sacrificial structures 704 at different tier 706 elevations throughout the height of the staircases. However, at the base of each initial stadium opening 802, the tier 706 elevations of the steps 118 in the initial descending staircase 128 are substantially the same tier 706 elevations as the steps 118 in the initial ascending staircase 130.

Figure 9:
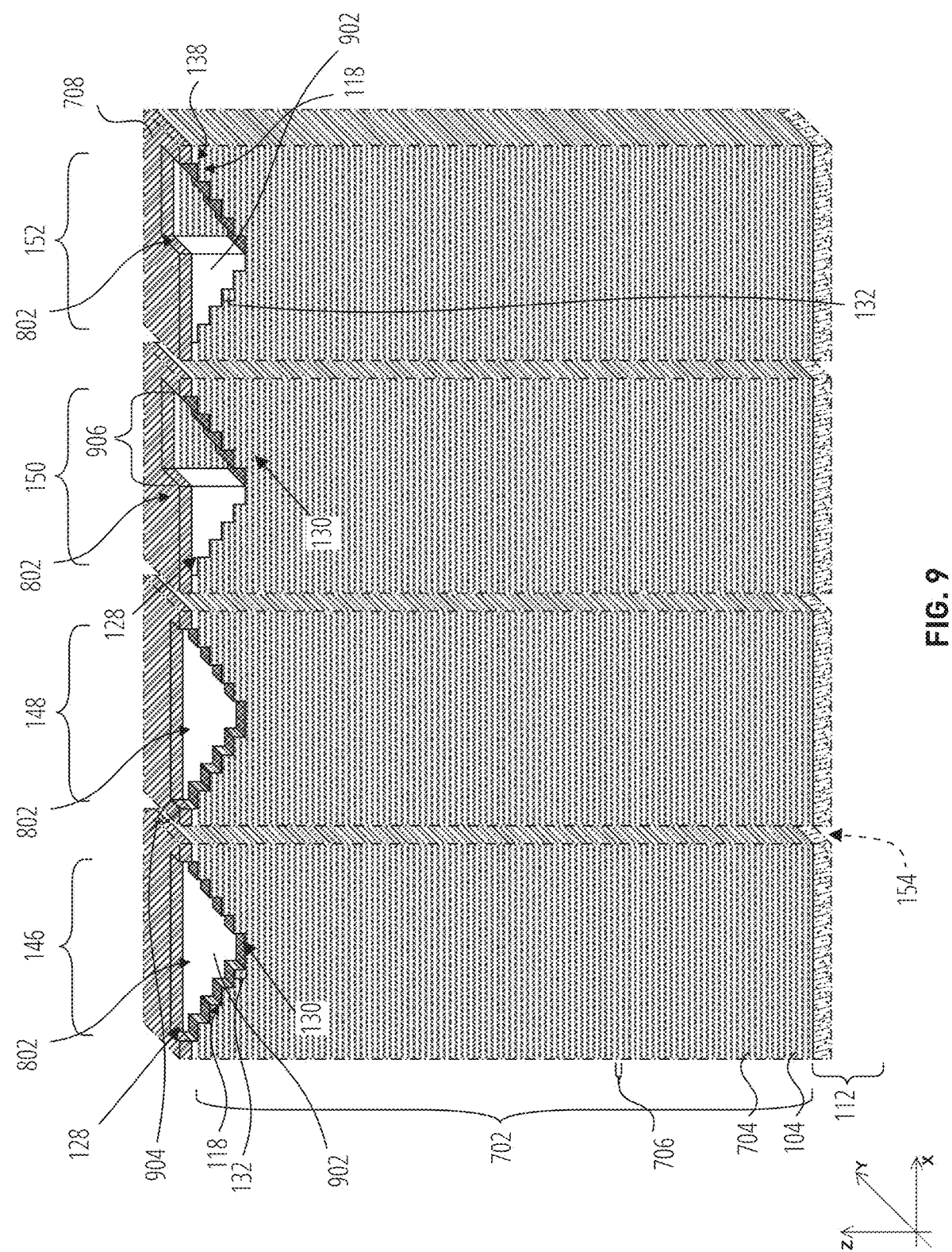

With reference to FIG. 9, one or more fill materials 902 and the mask 708 may be formed (or re-formed) and patterned to expose—in the stadium areas for the multi-set stadiums 126 (FIG. 5), e.g., in the first stadium area 146 and the second stadium area 148—only a front half 904 (e.g., a longitudinally forward half) of the initial stadium opening 802. Concurrently, subsequently, or previously, the fill material(s) 902 and the mask 708 may be formed (or re-formed) and patterned to expose—in the stadium areas for the single-set stadiums 124 (FIG. 4), e.g., in the third stadium area 150 and the fourth stadium area 152—only a lateral half 906 of the initial stadium opening 802 (FIG. 8). In some embodiments, these select exposing acts may be carried out substantially concurrently for the two different stadium types, for fabrication efficiencies and cost savings.

The one or more fill materials 902 may be formed of and include a material that is selectively removable relative to the materials of the stack 702. Accordingly, the fill material(s) 902 may be formed of one or more sacrificial materials, such as, e.g., a polysilicon material.

Figure 10:
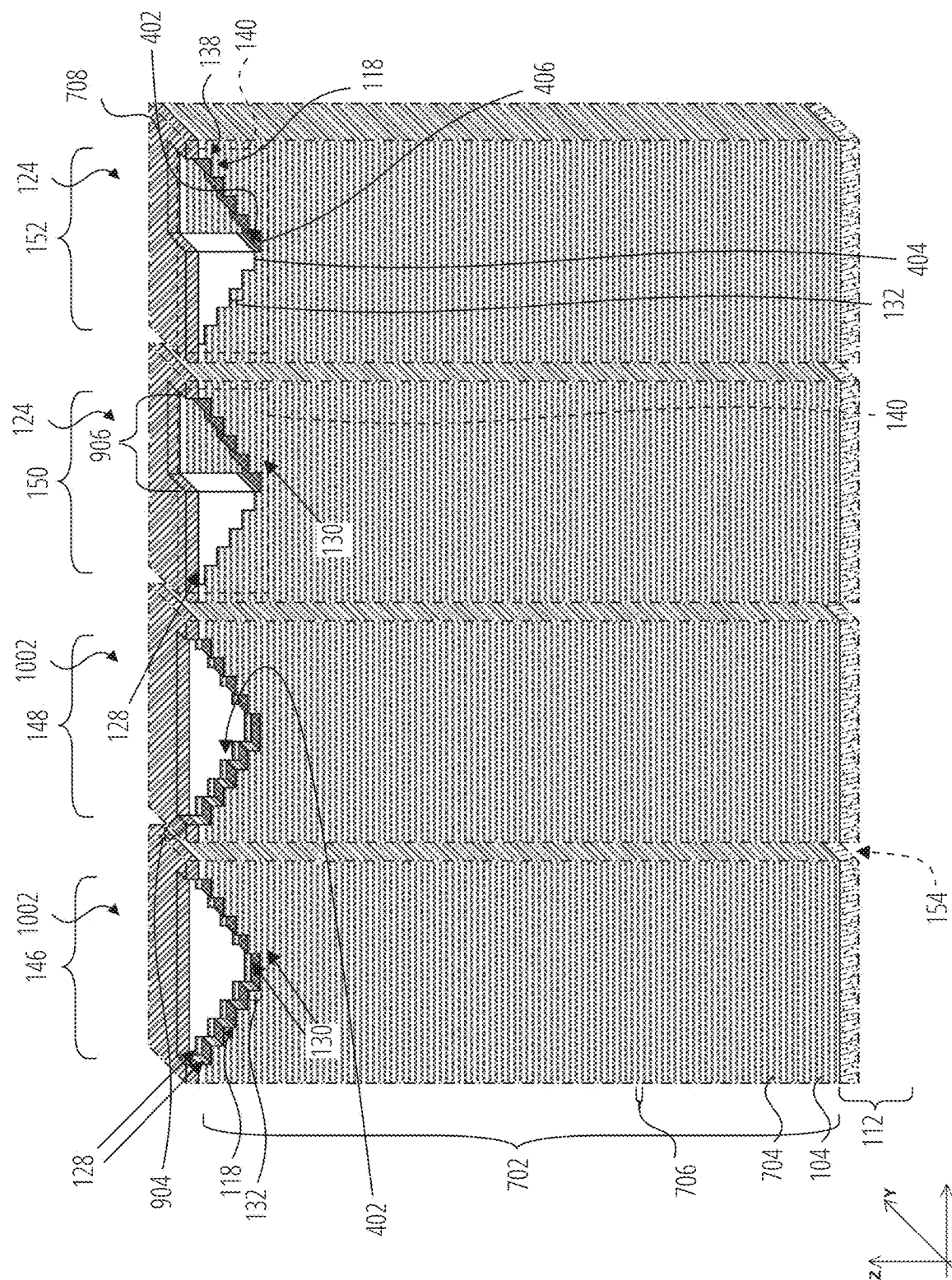

With reference to FIG. 10, the exposed areas-that is, the front half 904 for the multi-set stadiums 126 (FIG. 5) (in the first stadium area 146 and the second stadium area 148) and the lateral half 906 for the single-set stadiums 124 (FIG. 4) (in the third stadium area 150 and the fourth stadium area 152) subjected to a material-removal act to remove a consistent amount of the stack 702 materials to lower the staircase profiles, in only the exposed areas, the amount of the offset (e.g., the one-tier offset 402). This elevationally separates the neighboring parallel staircase sets of the multi-set stadiums 126 (FIG. 5) and elevationally separate the ascending staircase 130 from the descending staircase 128 (e.g., lowers the initial step 406 of the ascending staircase 130 from the final step 404 of the descending staircase 128) in the single-set stadiums 124 (FIG. 4). Accordingly, using the same offset height (e.g., the same one-tier offset 402) for both the multi-set stadiums 126 (FIG. 5) and the single-set stadiums 124 (FIG. 4) facilitates forming the offset concurrently in both types of stadiums for further fabrication efficiency.

Figure 11:
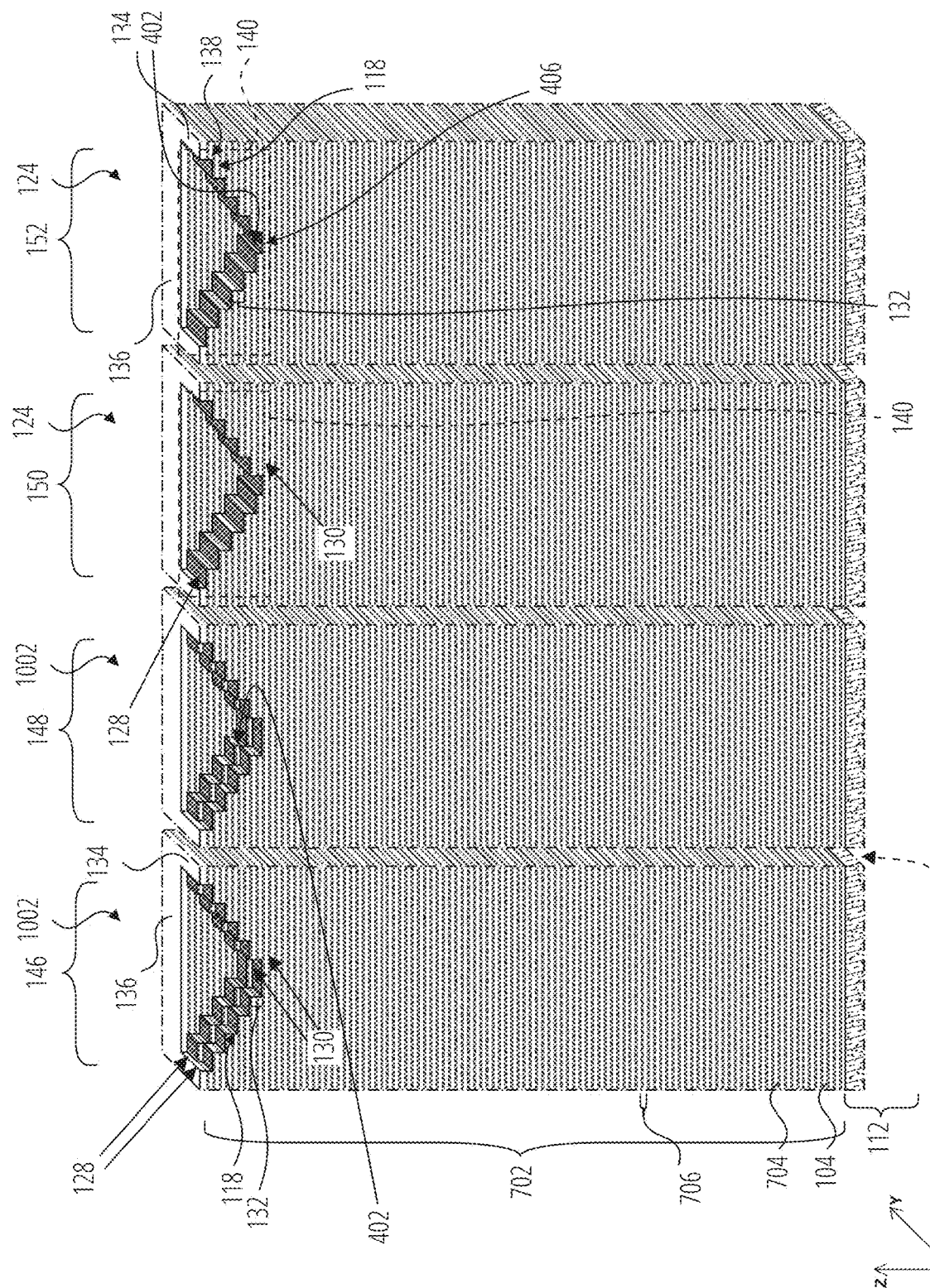

FIG. 11 illustrates the results of the stage of FIG. 10, with the fill material 902 (FIG. 9) and mask 708 not illustrated for ease of viewing. However, after the stage illustrated in FIG. 10, the fill material 902 (FIG. 9) and the mask 708 may or may not be removed before the stage illustrated in FIG. 12.

With further regard to FIG. 11, the formation of the one-tier offset 402 (during the stage illustrated in FIG. 10) in the first stadium area 146 and the second stadium area 148 forms an intermediate multi-set stadium 1002 with multiple parallel descending staircases 128 that are opposed and mirrored by multiple parallel ascending staircases 130. The formation of the one-tier offset 402 in the third stadium area 150 and the fourth stadium area 152 offsets the ascending staircase 130 from the descending staircase 128 to form the profile of the single-set stadium 124 matching that of box 140 illustrated in enlarged view in FIG. 4, though at elevations of the stack 702 well above the final elevations for the single-set stadiums 124.

Figure 12:
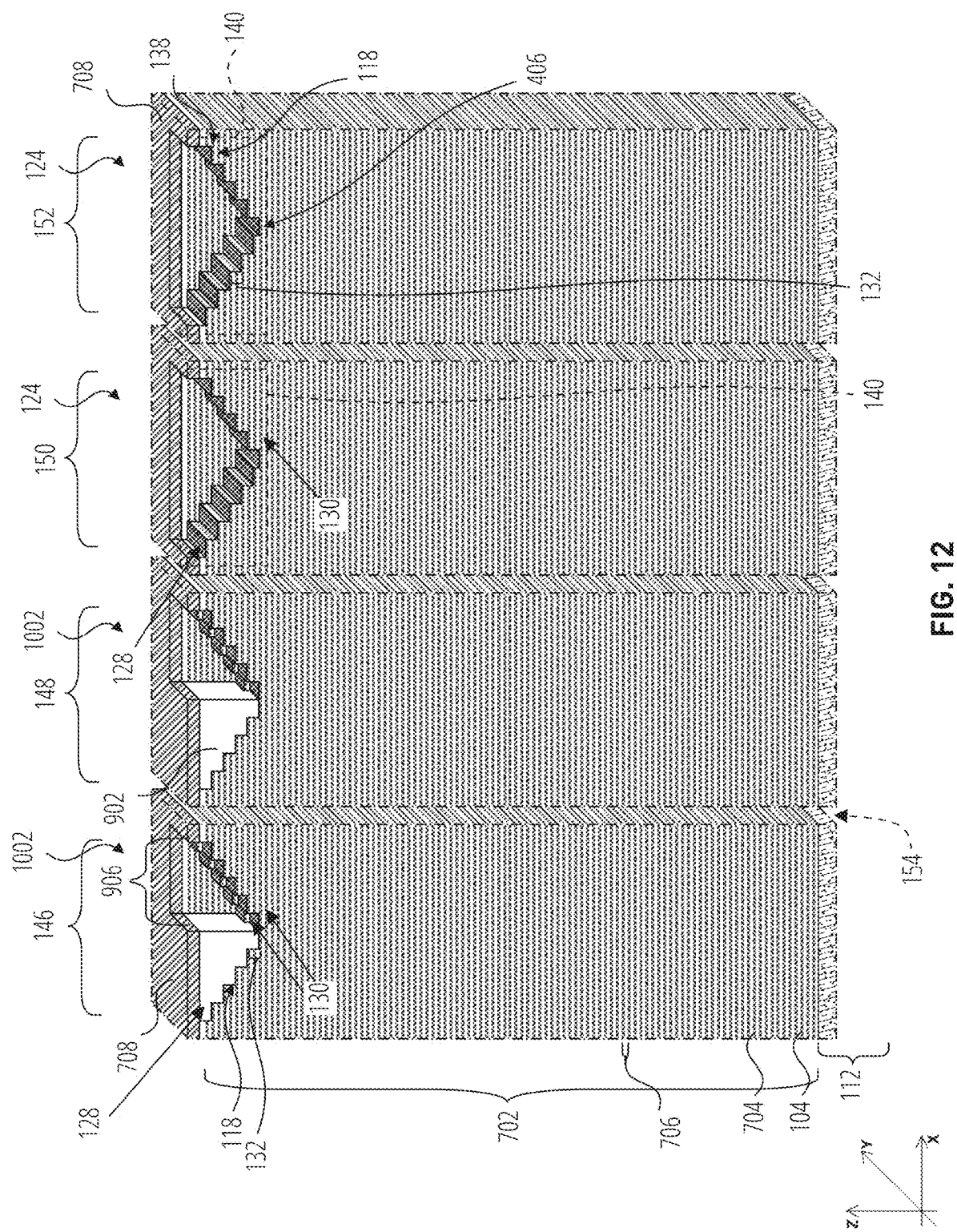

With reference to FIG. 12, one or more fill materials 902 and the mask 708 may be formed and/or re-formed and re-patterned to leave exposed the whole width of the single-set stadiums 124 (in the third stadium area 150 and the fourth stadium area 152) for any such single-set stadiums 124 not already at their final depths in the stack 702. Concurrently, the fill materials 902 and the mask 708 may be patterned to leave exposed only one lateral half 906 of each intermediate multi-set stadium 1002 (in the first stadium area 146 and the second stadium area 148). In embodiments in which one of the single-set stadiums 124 is already at its final depths after the formation of the one-tier offset 402 (FIG. 10), then this at-completed-depth single-set stadium 124 may be wholly filled with the fill material(s) 902 and left covered by the mask 708 during the stage illustrated in FIG. 12.

Figure 13:
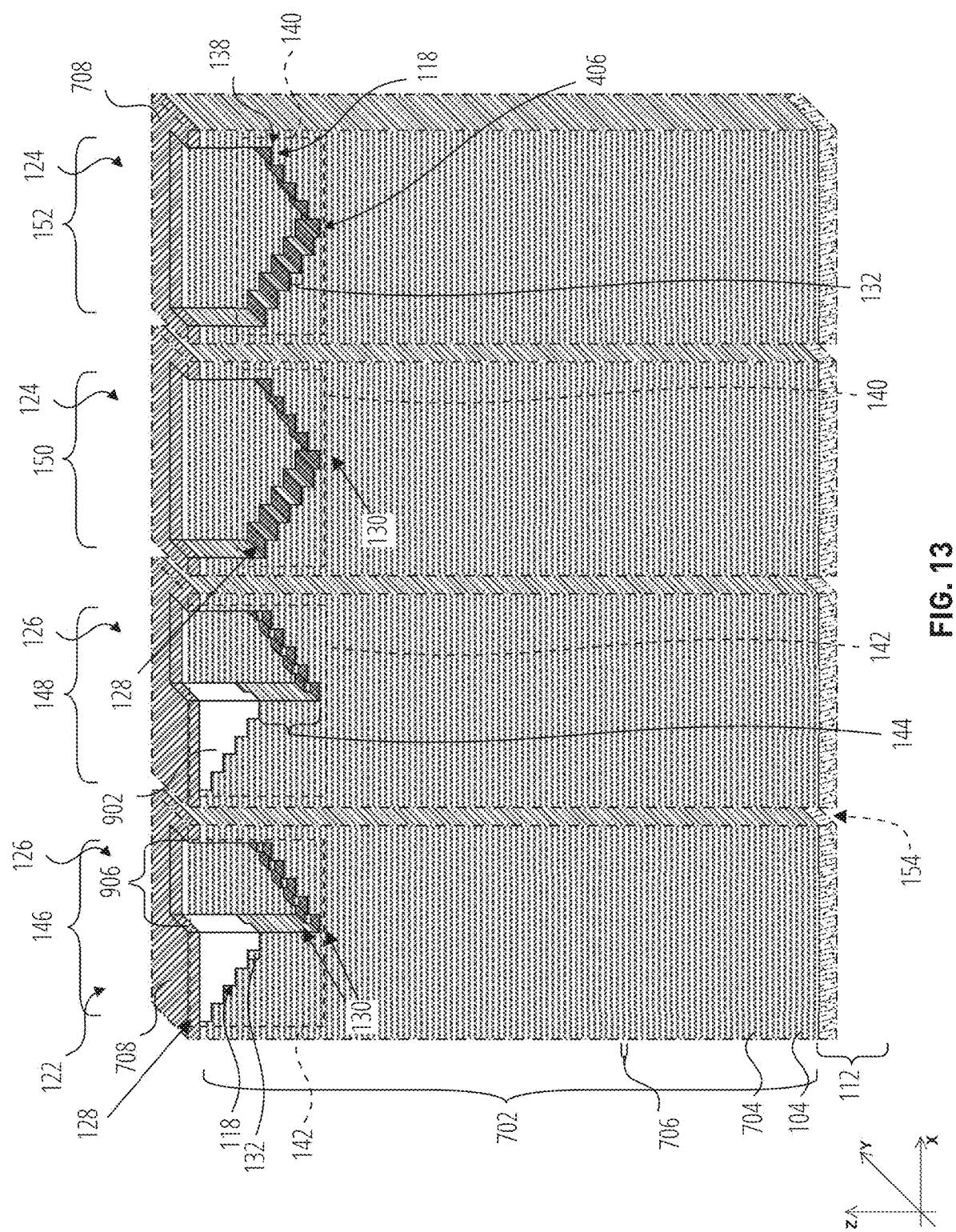

With reference to FIG. 13, the exposed areas may then be etched the depth of the half-stadium offset 144. Accordingly, this stage may extend, deeper into the stack 702, the ascending staircases 130 in the first stadium area 146 and the second stadium area 148 to form the profile of the multi-set stadiums 126 matching that of box 142 illustrated in enlarged view in FIG. 5. Concurrently, the staircase profile of the single-set stadiums 124 (e.g., the not-yet-at-completed-depth single-set stadiums 124) are extended deeper into the stack 702 the same number of tiers 706 as the half-stadium offset 144. This concurrent depth extension, in both types of stadiums, may further contribute to fabrication efficiencies and cost savings.

Figure 14:
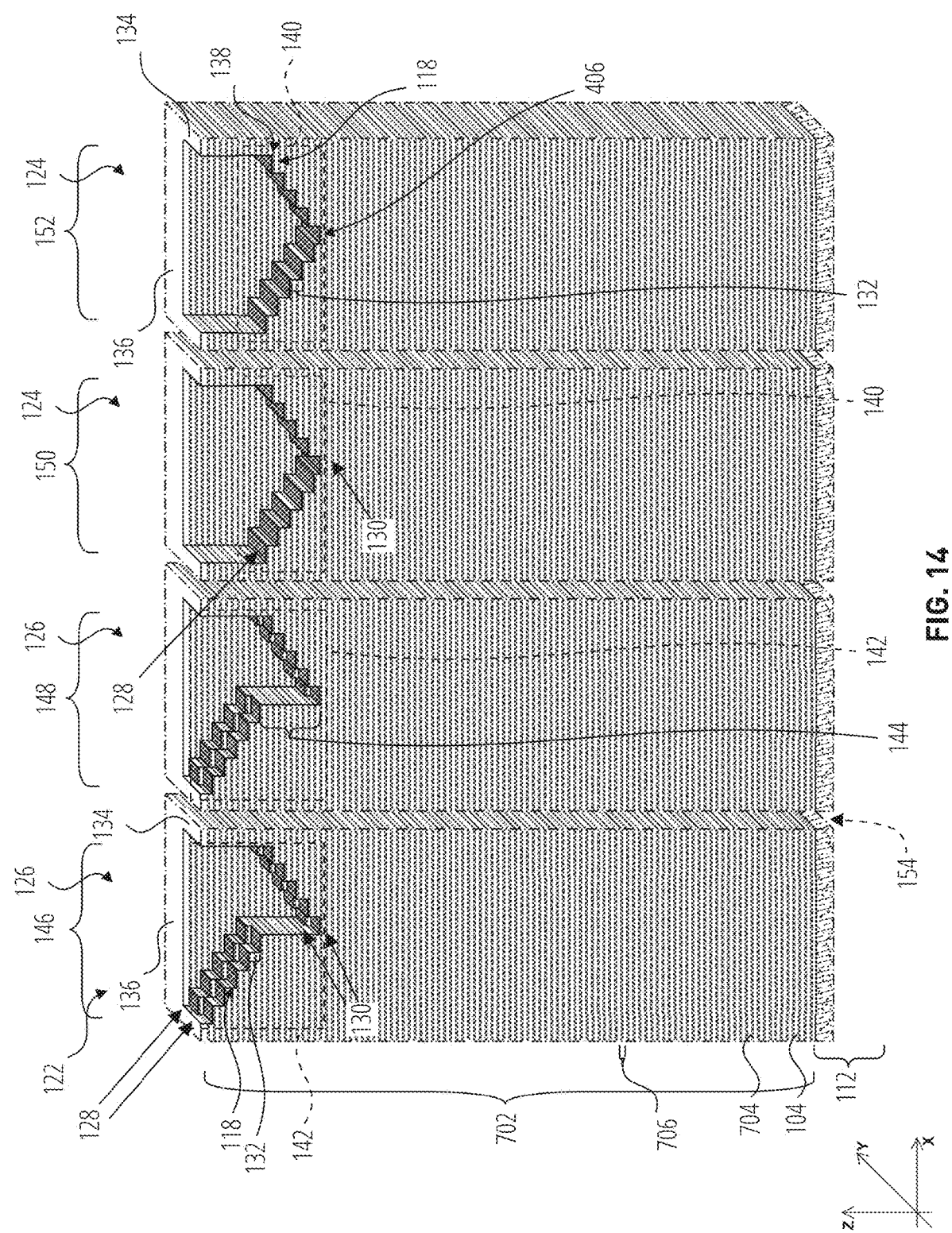

FIG. 14 illustrates the results of the stage of FIG. 13, with the fill material 902 (FIG. 13) and the mask 708 (FIG. 13) not shown for ease of viewing. However, after the stage illustrated in FIG. 13, the fill material 902 (FIG. 13) and the mask 708 may or may not be completely removed before the stage illustrated in of FIG. 15.

With further regard to FIG. 14, each step 118 within an individual stadium area (e.g., the first stadium area 146, the second stadium area 148, the third stadium area 150, the fourth stadium area 152) may be at a unique tier 706 elevation within that individual stadium area following the depth extensions for forming the half-stadium offset 144. However, the steps 118 in one of the multi-set stadiums 126 may be collectively at the same tier 706 elevations as the steps 118, collectively, in the others of the multi-set stadiums 126; and, except for any of the single-set stadiums 124 that were not exposed during the formation of the half-stadium offset 144, the steps 118 of an individual single-set stadium 124 may be collectively at the same tier 706 elevations as the steps 118 of an additional individual single-set stadium 124.

At this stage, the shallowest (e.g., vertically highest) of the multi-set stadiums 126 may already be at its final depth in the stack 702 and so the depth extension to form the half-stadium offset 144 may complete the formation of that multi-set stadium 126, e.g., in the first stadium area 146. Contrarily, the others of the multi-set stadiums 126 may not yet be at their final depths in the stack 702. Also, at this stage, the staircase profiles for the single-set stadiums 124 may not yet be at their final depths, such as in embodiments in which the single-set stadiums 124 are reserved for the deepest (e.g., vertically lowest) of the stadiums 122.

Figure 15:
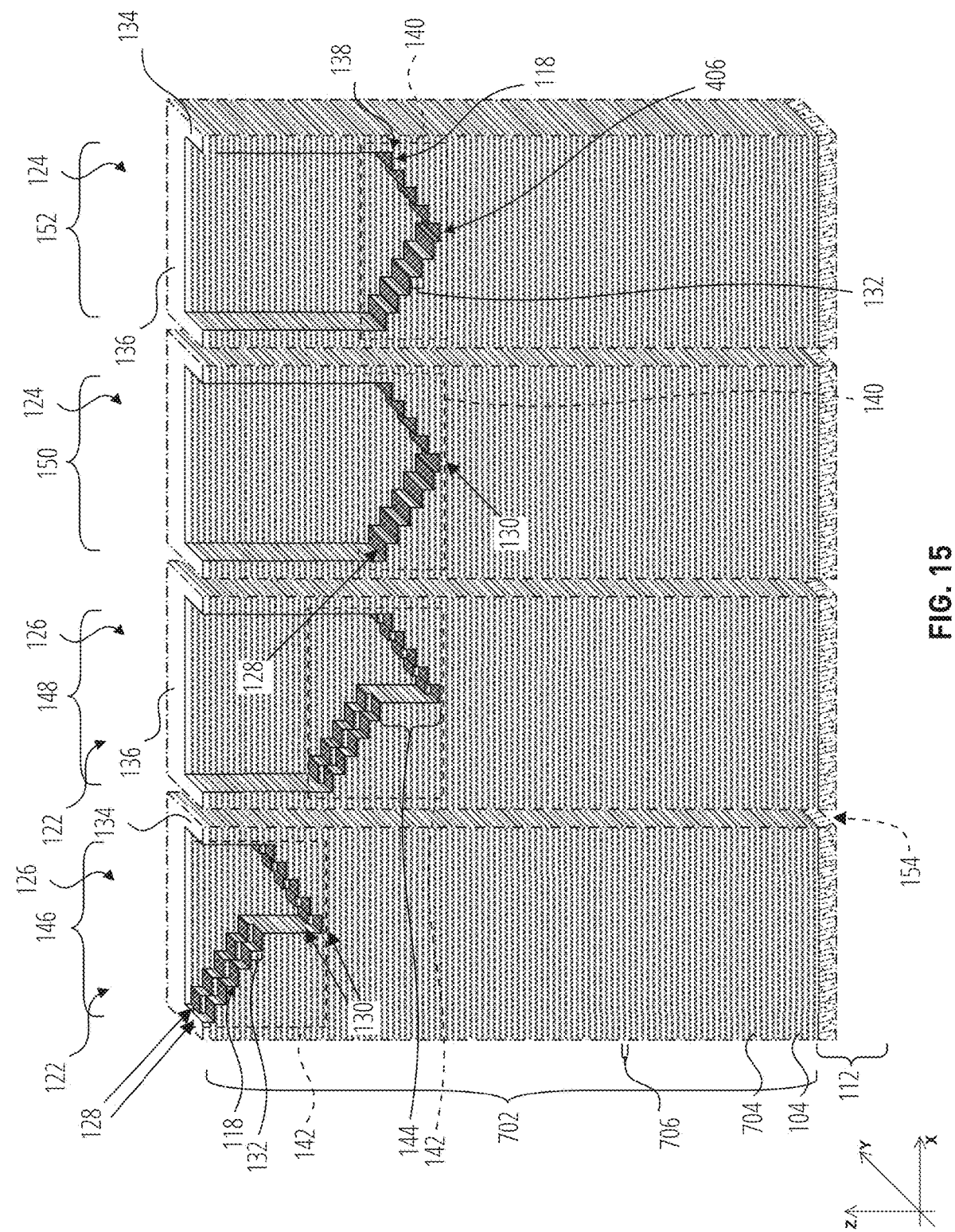

As illustrated in FIG. 15, the staircase profile of the second stadium area 148 may be extended to its final depth, to form the multi-set stadium 126 in the second stadium area 148 of FIG. 1. Concurrently, the staircase profiles in the third stadium area 150 and the fourth stadium area 152 may be extended downward a substantially equal number of tiers. During this stage, the already-completed stadium 122 in the first stadium area 146 may not be exposed (e.g., may be covered by additional fill material 902 (FIG. 9) and the mask 708 (FIG. 9) as in previously described stages).

Figure 16:
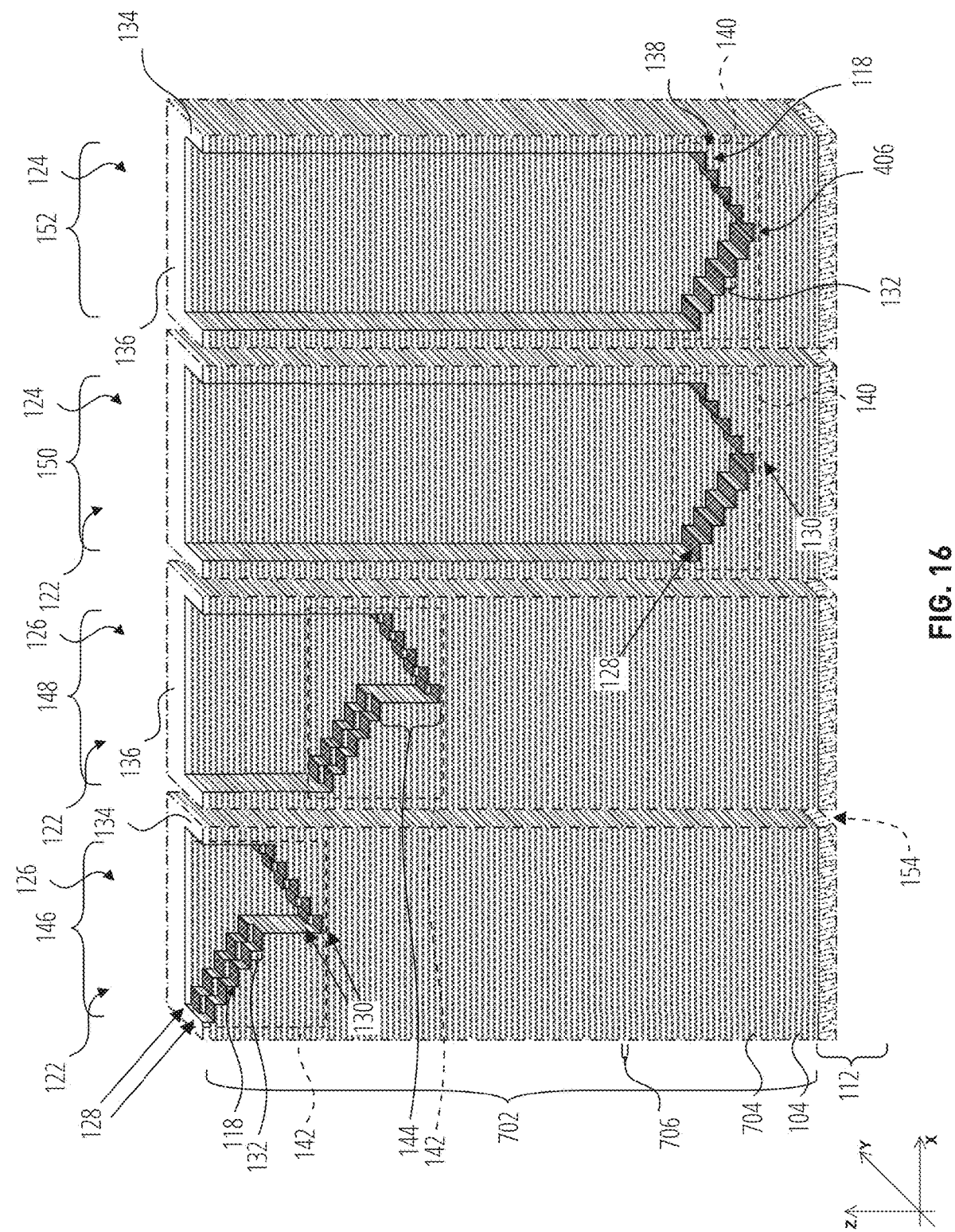
Figure 17:
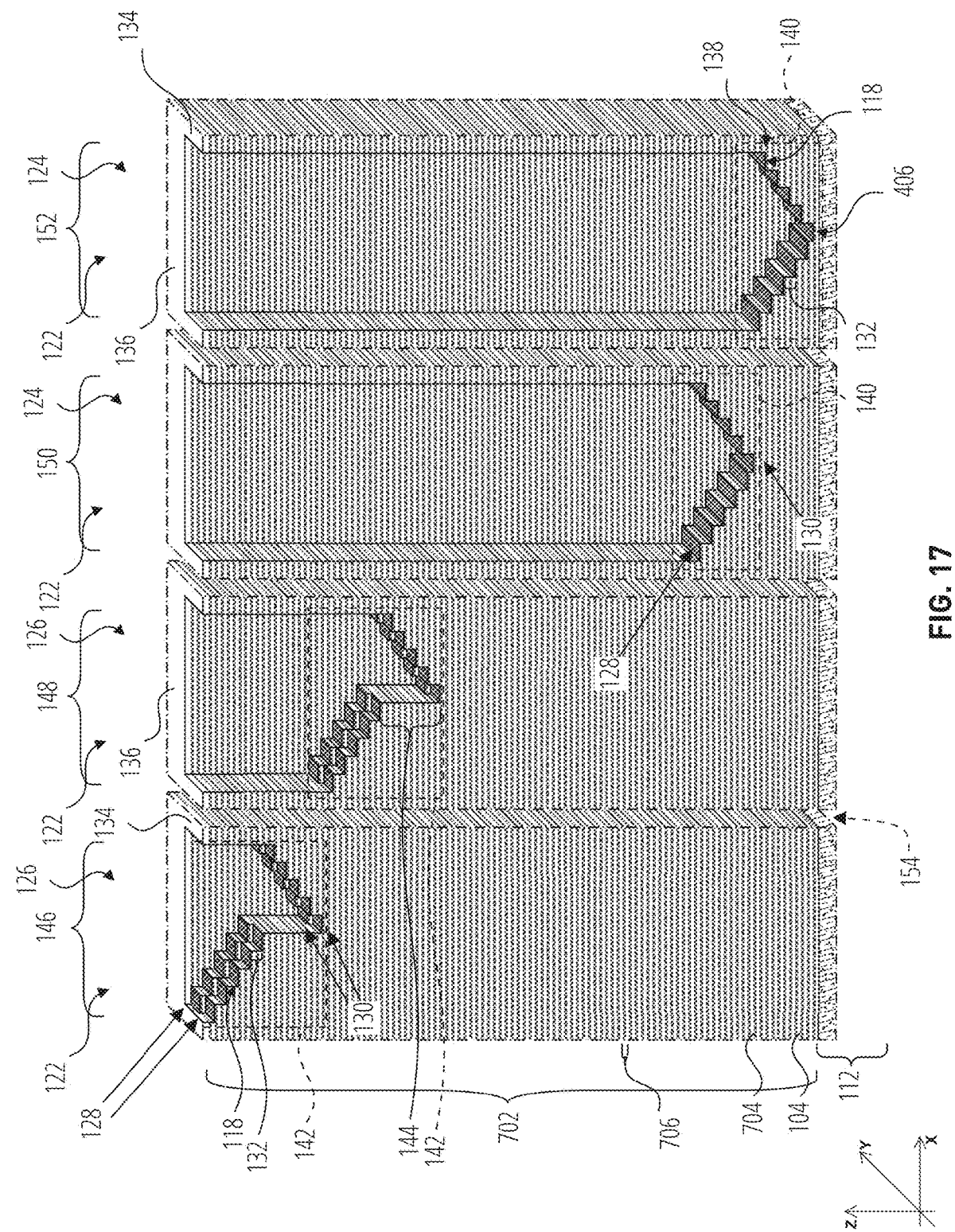

Thereafter, the staircase profile extensions may be continued downward in a sequence of depth-extension stages, for the not-yet-at-final-depth stadiums 122 (in the third stadium area 150 and the fourth stadium area 152) to lower the staircase profiles of the remaining stadiums 122 to their final elevations. For example, the staircases of the single-set stadiums 124 in the third stadium area 150 and the fourth stadium area 152 may be concurrently extended to the final elevation of the single-set stadium 124, as illustrated in FIG. 16 (e.g., while the multi-set stadiums 126 in the first stadium area 146 and the second stadium area 148 are filled and/or covered). Then, the single-set stadium 124 in the fourth stadium area 152 may be extended to its final elevation, as illustrated in FIG. 17 (e.g., while the other stadiums 122, already at their final depths, are filled and/or covered).

Figure 18:
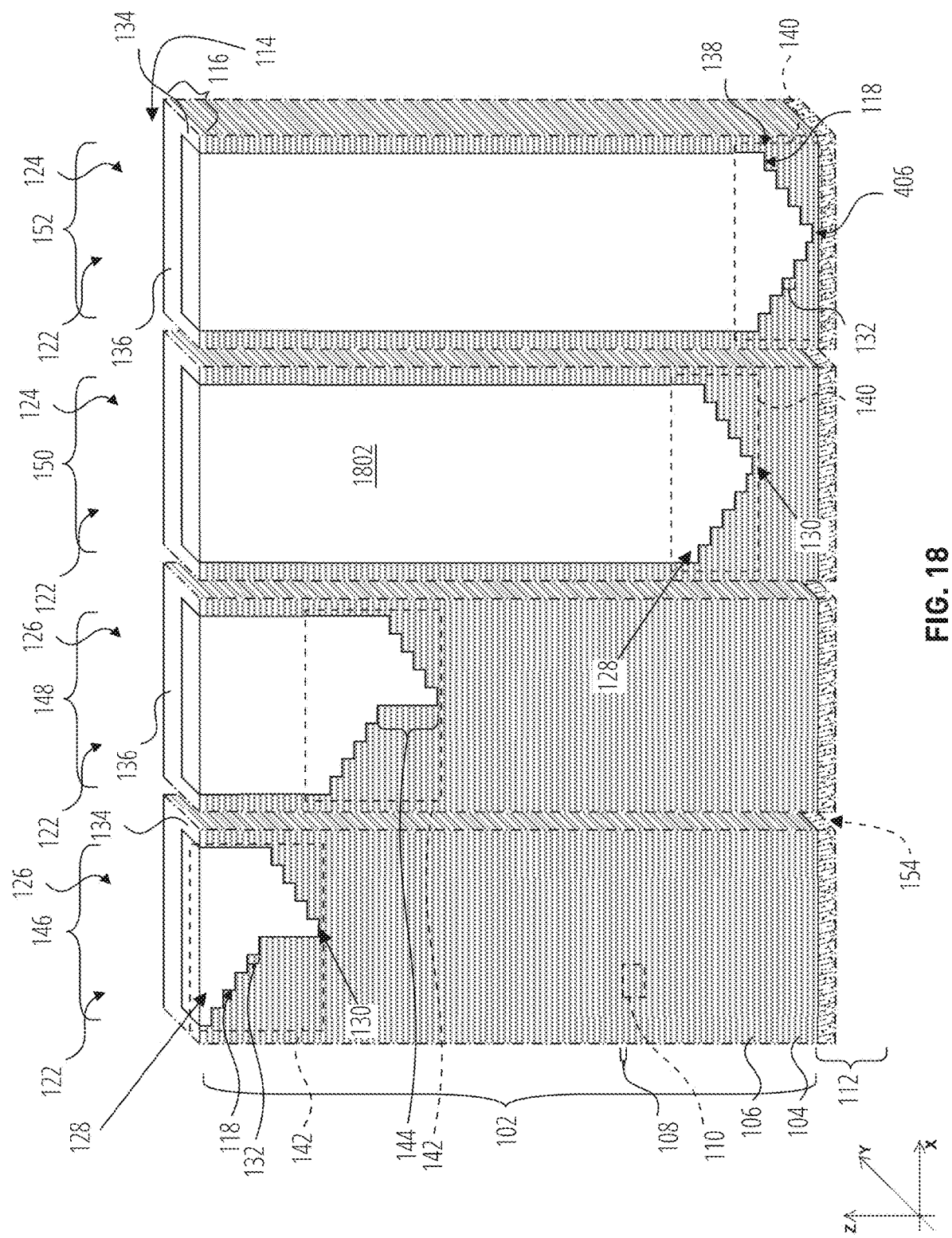

With reference to FIG. 18, one or more insulative fill material(s) 1802 (e.g., dielectric material(s)) may be formed (e.g., deposited) in the stadium openings, substantially filling the space above each of the completed stadiums 122.

The slits 114 may be formed (e.g., etched) through a whole height of the stack 702 (FIG. 17) to divide the stack 702 into the blocks 116.

In embodiments in which the stack 702 (FIG. 17) was formed to include sacrificial structures 704 (FIG. 17) (rather than the conductive structures 106), the sacrificial structures 704 may be substantially removed (e.g., exhumed)—by way of the slits 114—and replaced with the conductive material(s) of the conductive structures 106—or may be otherwise converted to the conductive material(s)—to form, as illustrated in FIG. 18, the stack 102 with the tiers 108 of the conductive structures 106 and the insulative structures 104. By this replacement process, the stadiums 122 then include the steps 118 exposing areas of the conductive structures 106 of the stepped tiers 138. Additional non-conductive fill material(s) may be formed (e.g., deposited) to fill the slits 114.

To complete the microelectronic device structure 100 of FIG. 1, contact openings may be formed (e.g., etched) through the insulative fill material(s) 1802, and conductive material(s) may be formed (e.g., deposited) in the contact openings to form the step contacts 120 extending through the insulative fill material(s) 1802 to their respective steps 118.

Accordingly, disclosed is a method of forming a microelectronic device. The method comprises forming a tiered stack over a base structure. The tiered stack comprises a vertically alternating sequence of insulative structures and other structures arranged in tiers. Portions of the tiered stack are removed to form a series of stadiums in the tiered stack. The series of stadiums comprises a stadium comprising multiple parallel sets of staircases individually having steps comprising ends of some of the tiers. The steps define a riser height encompassing vertical thicknesses of multiple of the tiers. The series of stadiums also comprises an additional stadium comprising only one set of staircases having additional steps comprising ends of some other of the tiers. The additional steps define the riser height.

Figure 19:
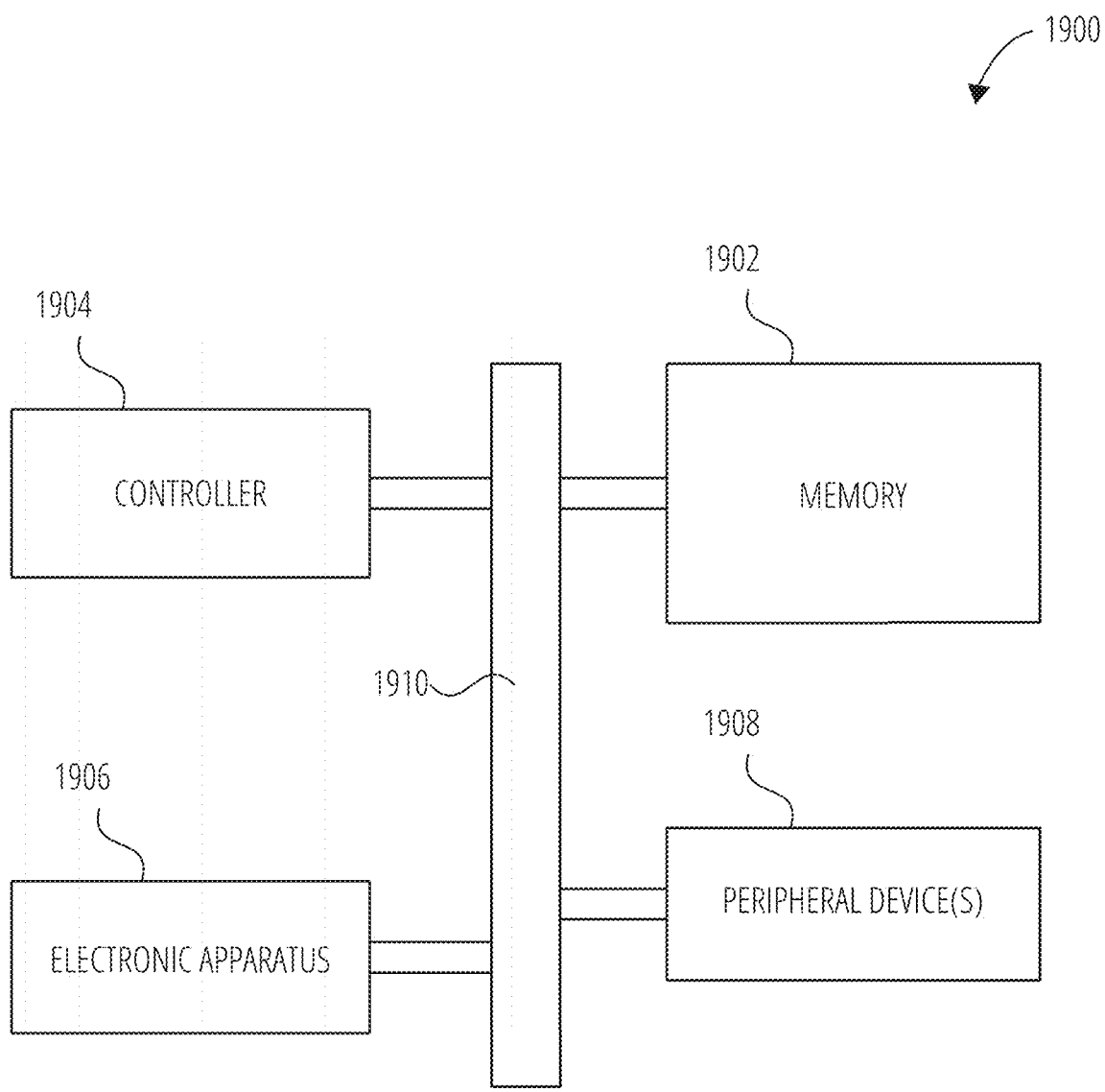
FIG. 19 is a block diagram of an electronic system including a microelectronic device that includes at least one microelectronic device structure of embodiments of the disclosure.

FIG. 19 shows a block diagram of a system 1900, according to embodiments of the disclosure, which system 1900 includes memory 1902 including arrays of vertical strings of memory cells adjacent microelectronic device structure(s) (e.g., microelectronic device structure 100 of FIG. 1 and FIG. 3; and/or microelectronic device structure 600 of FIG. 6). Therefore, the architecture and structure of the memory 1902 may include one or more device structures according to embodiments of the disclosure and may be fabricated according to one or more of the methods described above (e.g., with reference to FIG. 6 through FIG. 18).

The system 1900 may include a controller 1904 operatively coupled to the memory 1902. The system 1900 may also include another electronic apparatus 1906 and one or more peripheral device(s) 1908. The other electronic apparatus 1906 may, in some embodiments, include one or more of microelectronic device structures (e.g., microelectronic device structure 100 of FIG. 1 and FIG. 3; and/or microelectronic device structure 600 of FIG. 6), according to embodiments of the disclosure and fabricated according to one or more of the methods described above. One or more of the controller 1904, the memory 1902, the other electronic apparatus 1906, and the peripheral device(s) 1908 may be in the form of one or more integrated circuits (ICs).

A bus 1910 provides electrical conductivity and operable communication between and/or among various components of the system 1900. The bus 1910 may include an address bus, a data bus, and a control bus, each independently configured. Alternatively, the bus 1910 may use conductive lines for providing one or more of address, data, or control, the use of which may be regulated by the controller 1904. The controller 1904 may be in the form of one or more processors.

The other electronic apparatus 1906 may include additional memory (e.g., with one or more microelectronic device structures (e.g., microelectronic device structure 100 of FIG. 1 and FIG. 3; and/or microelectronic device structure 600 of FIG. 6)), according to embodiments of the disclosure and fabricated according to one or more of the methods described above. Other memory structures of the memory 1902 and/or the other electronic apparatus 1906 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 1908 may include displays, imaging devices, printing devices, wireless devices, additional storage memory, and/or control devices that may operate in conjunction with the controller 1904.

The system 1900 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a microelectronic device, at least one processor, and at least one peripheral device. The microelectronic device comprises a stack structure comprising tiers. Each tier includes a conductive structure and an insulative structure vertically adjacent the conductive structure. The microelectronic device also comprises a series of staircased stadiums in the stack structure. The series of staircased stadiums comprise a first group of stadiums and a second group of stadiums. The stadiums of the first group of stadiums each individually include a single set of staircases having steps defined by edges of some of the tiers. The stadiums of the second group of stadiums each individually include multiple sets of staircases extending in parallel with one another and having additional steps defined by edges of some other of the tiers. The steps and the additional steps each define a riser height encompassing vertical thicknesses of at least two of the tiers. The at least one processor is in operable communication with the microelectronic device. The at least one peripheral device is in operable communication with the at least one processor.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
   a stack structure comprising a vertically alternating sequence of insulative structures and conductive structures arranged in tiers; and
   a series of stadiums within the stack structure and comprising:
      a stadium comprising multiple sets of staircases, each individual set of staircases of the multiple sets of staircases being parallel to and vertically offset from each other individual set of staircases of the multiple sets of staircases; and
      an additional stadium comprising a single set of staircases,
      each of the staircases, of the multiple sets of staircases and of the single set of staircases, comprising steps at ends of the conductive structures, each of the steps defining a riser height encompassing vertical thicknesses of multiple of the tiers.

2. The microelectronic device of claim 1, wherein the stadium is at a relatively lower elevation in the stack structure than the additional stadium.

3. The microelectronic device of claim 1, further comprising step contacts extending to the steps, a quantity of the step contacts within a first group of the step contacts extending to the steps of the stadium is at least twice a quantity of the step contacts within a second group of the step contacts extending to the steps of the additional stadium.

4. The microelectronic device of claim 1, wherein neighboring sets of staircases, of the multiple sets of staircases, are vertically offset from one another by a distance less than the riser height.

5. The microelectronic device of claim 1, wherein:
   for the multiple sets of staircases of the stadium, one set of staircases thereof is vertically offset from a neighboring one set of staircases thereof by a distance less than the riser height; and
   for the single set of staircases of the additional stadium, a descending staircase thereof is vertically offset from an ascending staircase thereof by the distance.

6. The microelectronic device of claim 5, wherein:
   the riser height is equal to the vertical thicknesses of two of the tiers; and
   the distance equals a vertical thickness of one of the tiers.

7. The microelectronic device of claim 1, wherein the stadium horizontally neighbors the additional stadium within the stack structure.

8. The microelectronic device of claim 1, further comprising string drivers vertically offset from the stack structure and in electrical communication with the conductive structures of the stack structure by way of the steps, a sequential order of the string drivers differing from an elevational order of the steps.

9. The microelectronic device of claim 1, wherein the series of stadiums further comprises:
   a further stadium comprising further multiple sets of staircases, the additional stadium horizontally interposed between the stadium and the further stadium; and
   an other stadium comprising an other single set of staircases, the further stadium horizontally interposed between the additional stadium and the other stadium.

10. The microelectronic device of claim 1, wherein the multiple sets of staircases of the stadium comprise:

a first set of staircases comprising a first descending staircase and a first ascending staircase; and a second set of staircases comprising a second descending staircase and a second ascending staircase, the second descending staircase being a single tier height lower in elevation than the first descending staircase, and the second ascending staircase being the single tier height lower in elevation than the second descending staircase.

11. The microelectronic device of claim 10, wherein a lowest of the steps of the second descending staircase is one tier elevation above an uppermost of the steps of the first ascending staircase.

12. The microelectronic device of claim 1, further comprising a crest portion of the stack structure interposed between the stadium and the additional stadium, an upper boundary of the crest portion being substantially coplanar with an upper boundary of the stack structure.

13. The microelectronic device of claim 12, further comprising a bridge portion neighboring the crest portion and the series of stadiums, an upper boundary of the bridge portion being substantially coplanar with the upper boundary of the stack structure.

14. The microelectronic device of claim 1, further comprising slits extending through the stack structure to define neighboring blocks, each of the neighboring blocks comprising one of the series of stadiums.

15. A method of forming a microelectronic device, the method comprising:

forming a tiered stack over a base structure, the tiered stack comprising a vertically alternating sequence of insulative structures and other structures arranged in tiers;

removing portions of the tiered stack to form a series of stadiums in the tiered stack, the series of stadiums comprising:

a stadium comprising multiple sets of staircases, each individual set of staircases of the multiple sets of staircases being parallel to and vertically offset from each other individual set of staircases of the multiple sets of staircases; and an additional stadium comprising a single set of staircase; and substantially replacing the other structures with conductive structures to form a stack structure comprising a vertically alternating sequence of the insulative structures and the conductive structures arranged in the tiers, the series of stadiums being within the stack structure, each of the staircases, of the multiple sets of staircases and of the single set of staircases, comprising steps at ends of the conductive structures, each of the steps defining a riser height encompassing vertical thicknesses of multiple of the tiers.

16. The method of claim 15, wherein removing portions of the tiered stack to form the series of stadiums comprises, for both the stadium and the additional stadium, concurrently forming initial stadium openings each defining an initial descending staircase and an initial ascending staircase opposing and mirroring the initial descending staircase.

17. The method of claim 16, wherein concurrently forming the initial stadium openings comprises forming the initial descending staircase and the initial ascending staircase to have initial steps defining the riser height.

18. The method of claim 16, further comprising, concurrently:

for the stadium, extending only a front half of one of the initial stadium openings relatively deeper into the tiered stack by a vertical height of one of the tiers to form an intermediate stadium opening; and for the additional stadium, extending only a lateral half of another one of the initial stadium openings relatively deeper into the tiered stack by the vertical height of the one of the tiers to form an additional intermediate stadium opening.

19. The method of claim 18, further comprising, concurrently:

for the stadium, extending only a lateral half of the intermediate stadium opening relatively deeper into the tiered stack by a vertical distance; and for the additional stadium, extending an entire width of the additional intermediate stadium opening relatively deeper into the tiered stack by the vertical distance.

20. An electronic system, comprising:

a microelectronic device comprising:

a stack structure comprising a vertically alternating sequence of insulative structures and conductive structures arranged in tiers, each of the tiers including one of the conductive structures and one of insulative structures vertically adjacent the one of the conductive structures; and a series of stadiums within the stack structure and comprising:

a first group of stadiums each individually including a single set of staircases; and a second group of stadiums each individually including multiple sets of staircases, each individual set of staircases of the multiple sets of staircases being parallel to and vertically offset from each other individual set of staircases of the multiple sets of staircases, each of the staircases, of the multiple sets of staircases and of the single set of staircases, comprising steps at ends of the conductive structures, each of the steps defining a riser height encompassing vertical thicknesses of multiple of the tiers;

at least one processor in operable communication with the microelectronic device; and at least one peripheral device in operable communication with the at least one processor.

* * * * *